(12) United States Patent
Hashimoto

(10) Patent No.: US 6,191,829 B1
(45) Date of Patent: Feb. 20, 2001

(54) OPTICAL APPARATUS FOR OPTICALLY ROTATING A PORTION OF A POLARIZATION AXIS OF A LINEARLY POLARIZED LIGHT

(75) Inventor: Nobuyuki Hashimoto, Iruma (JP)

(73) Assignee: Citizen Watch Co., Ltd., Tokyo (JP)

( * ) Notice: Under 35 U.S.C. 154(b), the term of this patent shall be extended for 0 days.

(21) Appl. No.: 09/077,320

(22) PCT Filed: Oct. 8, 1997

(86) PCT No.: PCT/JP97/03623

§ 371 Date: Jun. 5, 1998

§ 102(e) Date: Jun. 5, 1998

(87) PCT Pub. No.: WO98/15952

PCT Pub. Date: Apr. 16, 1998

(30) Foreign Application Priority Data

| Oct. 8, 1996 | (JP) | 8-266881 |
| Oct. 31, 1996 | (JP) | 8-289927 |
| Oct. 31, 1996 | (JP) | 8-289928 |
| Sep. 10, 1997 | (JP) | 9-245271 |

(51) Int. Cl.⁷ .................................................. G02F 1/133
(52) U.S. Cl. .............................................. 349/17; 349/129
(58) Field of Search ................................ 349/1, 17, 200, 349/201, 202, 129; 359/16, 637; 250/550, 201.9; 356/124, 124.5

(56) References Cited

U.S. PATENT DOCUMENTS

| 5,426,521 | * | 6/1995 | Chen et al. ................ | 359/9 |
| 5,579,136 | * | 11/1996 | Fukui et al. ............... | 349/74 |
| 5,682,214 | * | 10/1997 | Amako et al. ............. | 349/74 |
| 5,684,545 | * | 11/1997 | Dou et al. .................. | 349/1 |
| 5,708,488 | * | 1/1998 | Fukui et al. ............... | 349/76 |
| 5,815,233 | * | 9/1998 | Morokawa et al. ......... | 349/200 |
| 5,841,489 | * | 11/1998 | Yoshida et al. ............ | 349/17 |

FOREIGN PATENT DOCUMENTS

| 6-28704 | 2/1994 | (JP) . |
| 9-223324 | 8/1997 | (JP) . |

OTHER PUBLICATIONS

Japanese Journal of Applied Physics, vol. 28 (1989) Supplement 28–3, pp. 197–200.

* cited by examiner

*Primary Examiner*—Kenneth Parker
(74) *Attorney, Agent, or Firm*—Armstrong, Westerman, Hattori, McLeland & Naughton

(57) ABSTRACT

An optical apparatus provided with a focusing optics (104) for focusing linearly polarized light has a construction wherein an optical rotatory element (103) having a region for optically rotating a polarization axis of the linearly polarized light in at least a portion thereof is disposed in the optical path of the linearly polarized light so as to differentiate locally the orientation of the polarization axis of the linearly polarized light falling thereon. The optical rotatory element (103) is preferably composed of a θ° optically rotatable region (103a) capable of optically rotating a polarization axis of the linearly polarized light falling thereon by an optional angle θ°, and a (θ−90)° optically rotatable region (103b) capable of optically rotating a polarization axis of the linearly polarized light falling thereon substantially by an angle of (θ−90)°. By disposing the optical rotatory element (103) in the optical path of the linearly polarized light, and by differentiating locally the orientation of the polarization axis of the linearly polarized light falling thereon superresolved images can be formed without attenuating amount of light.

20 Claims, 20 Drawing Sheets

OPTICAL APPARATUS FOR OPTICALLY ROTATING A PORTION OF A POLARIZATION AXIS OF A LINEARLY POLARIZED LIGHT

TECHNICAL FIELD

The present invention relates to a superresolving optical apparatus, applicable to optical disc systems, photolithographic masking systems, and the like. More particularly, the invention is concerned with an optical apparatus which has a high optical utilization ratio and is yet capable of electrically altering a numerical aperture thereof with ease with respect to optical discs whose proper numerical apertures for image formation differ from each other, such as digital versatile discs (DVDs), compact discs (CDs), and the like.

BACKGROUND TECHNOLOGY

The numerical aperture of an optical system is briefly described hereinafter to facilitate understanding of the conventional technologies concerned.

In an optical system designed to have little aberration according to geometrical optics, a focused spot must in theory be infinitely small in size. However, it has, in fact, a spatial spread in a finite size due to the effect of optical diffraction owing to the wave motion characteristic of light.

Now, provided that a numerical aperture of an optical system, contributing to optical image formation or condensing of light, is designated NA, the spatial spread of a focused spot is defined by the following formula:

$$k \times \lambda \div NA \quad (1)$$

where $\lambda$=light wavelength k=a constant for respective optical systems (a value, normally, in the range from 1 to around 2). Further, the numerical aperture NA is proportional to a ratio of the diameter D of an effective entrance pupil of an optical system (generally the diameter of an effective light beam) to a focal length f, that is: D/f.

The spatial spread of the focused spot as expressed by the formula given above represents a theoretical resolution limit of the optical system, and is also called a diffraction limit.

As is evident from the above formula, a theoretical resolution may be enhanced by use of a light beam at a shorter wavelength $\lambda$, or by enlarging the numerical aperture NA of an optical system. However, a short wavelength light source is generally complex in construction, and higher in production cost.

Particularly, in the case of a laser light source used for optical disc systems, photolithographic masking systems, and the like, this tendency becomes more pronounced. Further, the greater the numerical aperture of an optical system, the more the optical system becomes prone to have aberration due to geometrical optics. Accordingly, for recording information on common optical disc systems, a semiconductor laser for emitting a light beam at a wavelength on the order of 700 nm is used as a light source while a condensing optics having the numerical aperture NA on the order of 0.5 is used.

As the conventional technology capable of achieving superresolution by use of the light source and condensing optics described above, a superresolving optical system constructed such that a portion of an effective light beam falling on the condensing optics is shielded with a shading band is well known (reference: Japanese Journal of Applied Physics, Vol. No. 28 (1989) Supplement 28-3, pp. 197–200).

It appears that with this superresolving optical system using the shading band, a focused spot size is rendered narrower by 10 to 20% with respect to the theoretical resolution limit of the optical system.

However, shielding a portion of the effective light beam falling on the condensing optics by means of the shading band will result in a lower optical utilization rate. Furthermore, with the superresolving optical system described above wherein the central region of a light beam, including the optical axis, is shielded with the shading band, degradation in the optical utilization ratio becomes further pronounced because the central region of the light beam generally belongs to a high intensity zone according to the distribution of light intensity.

Such a low optical utilization rate inevitably requires use of a light source capable of outputting higher power, resulting in a higher cost of an optical apparatus because such a high power output light source is expensive. Particularly, for application to optical disc systems, a semiconductor laser light source, expensive even at low power output, is used, and consequently, it is practically impossible to employ a high power output light source from the cost point of view.

The invention has been developed in light of the circumstances described above, and a main object thereof is to realize superresolution without sacrificing optical utilization ratio.

DISCLOSURE OF THE INVENTION

In order to achieve the object described above, in an optical apparatus according to the invention, provided with a condensing optics for condensing linearly polarized light, an optical rotatory element having a region for optically rotating a polarization axis of the linearly polarized light in at least a portion thereof is disposed in the optical path of the linearly polarized light so as to locally differentiate the orientation of the polarization axis of the linearly polarized light falling on the optical rotatory element.

By disposing the optical rotatory element in the optical path of the linearly polarized light, and locally differentiating the direction of the polarization axis of the linearly polarized light falling thereon, orientations of components of the linearly polarized light, falling on different regions thereof, can be varied so as to differ from each other. In the linearly polarized light consisting of the components having polarization axes differing from each other in orientation, interference between the components is restrained. In particular, in the case that the polarization axes have an orthogonal relationship, interference between the respective components of the linearly polarized light will disappear. When the interference is restrained as described, the linearly polarized light will behave as if one component thereof were shaded by the other component. As a result, a superresolved image can be formed.

The optical rotatory element is intended to optically rotate the polarization axis of the linearly polarized light falling thereon, but the linearly polarized light falling thereon will not be shaded by the optical rotatory element. Hence, large power loss of the linearly polarized light does not occur in the optical rotatory element with the result that the linearly polarized light can be effectively put to use.

The optical apparatus according to the invention, having such a high optical utilization ratio, is highly suitable for application to optical systems with bright prospects of growth in the near future, for example, digital versatile discs (DVDs), and writable and rewritable digital versatile discs (DVDs-R). That is, although high density recording is desired of DVDs as well as DVDs-R in future, use of a semiconductor laser with relatively low power output is required as a light source from the cost point of view. The optical apparatus according to the invention can meet all such requirements.

The optical apparatus according to the invention is effective also for the photolithographic masking systems used in the fabrication of LSIs, which is expected to require a higher degree of integration in the future. That is, with the optical apparatus according to the invention, superresolved images can be formed without greatly attenuating light amounts, to the extent of which exposure time is shortened, and consequently, a risk of misalignment of exposure position due to vibration and the like is lessened, enabling enhancement of production yield.

Further, with the optical apparatus according to the invention, the optical rotatory element may preferably be composed of a θ optically rotatable region capable of optically rotating the polarization axis of the linearly polarized light falling thereon by an optional angle θ°, and a (θ−90)° optically rotatable region capable of optically rotating the polarization axis of the linearly polarized light falling thereon substantially by an angle of (θ−90)°.

By adopting such a construction as described., the polarization axes of the components of the linearly polarized light, transmitted through the respective regions of the optical rotatory element, cross each other at right angles with the result that an interference phenomenon which will otherwise occur between the respective components of the linearly polarized light can be restrained with reliability, enabling formation of superresolved images.

Also, with a construction wherein the optical rotatory element has a 90° optically rotatable region capable of optically rotating the polarization axis of the linearly polarized light falling thereon substantially by 90°, and an optically unrotatable region capable of transmitting the linearly polarized light falling thereon without optically rotating the polarization axis of the linearly polarized light, the same effect of operation can be attained.

Further, with a construction wherein the optical rotatory element is divided into the θ optically rotatable region, and the (θ−90)° optically rotatable region by means of electrical control, changeover between superresolved images and ordinarily resolved images can be effected with ease.

This will enable the optical apparatus according to the invention to cope with optical discs in two different recording density modes (for example, optical discs for use as DVDs, and the same for use as CDs).

Such a construction as described above can be attained at low cost by use of a liquid crystal element for the optical rotatory element. Further, by causing an alignment direction of liquid crystal molecules of the liquid crystal element, on the incoming side of the linearly polarized light, to substantially coincide with, or cross at right angles with, the direction of the polarization aids of the linearly polarized light falling on the liquid crystal element, the linearly polarized light can be transmitted with keeping its linear polarization.

The θ° optically rotatable region of the optical rotatory element may be formed in, for example, a substantially circular or oblong shape centering around the optical axis of the linearly polarized light falling on the optical rotatory element, depending on type of application. In this case, a region of the optical rotatory element, other than the θ° optically rotatable region, is set to be the (θ−90)° optically rotatable region.

With the optical apparatus according to the invention, the same effect of operation can be attained by employing a 90° twisted-nematic liquid crystal element for the optical rotatory element, and causing the alignment direction of liquid crystal molecules of the liquid crystal element, on the incoming side of the linearly polarized light, to substantially coincide with, or cross at right angles with the direction of the polarization axis of the linearly polarized light falling on the liquid crystal element, while a portion of the liquid crystal element is turned into a homogeneous region wherein the liquid crystal molecules are aligned in the direction of the polarization axis of the linearly polarized light falling on the liquid crystal element, rendering the region to be the optically unrotatable region described above.

In this instance, through adoption of a construction wherein at least the 90° optically rotatable region is turned so that the liquid crystal molecules are homeotropic in alignment by applying a voltage thereto, changeover between superresolved images and ordinarily resolved images can be effected with ease.

Further, at least the entire region wherein the linearly polarized light falling on the 90° twisted-nematic liquid crystal element is transmitted may be set to be a 90° optically rotatable region while a portion of the 90° optically rotatable region may be turned into the optically unrotatable region by causing the liquid crystal molecules of the same to become homeotropic in alignment by applying a voltage.

In this connection, in the optical rotatory element, either of the 90° optically rotatable region or the optically unrotatable region may be formed in, for example, a substantially circular, or oblong shape centering around the optical axis of the linearly polarized light falling on the optical rotatory element, depending on type of application.

Now, when a superresolved image is realized by inserting the optical rotatory element in the optical path of the linearly polarized light, sidelobes (sidewave bands), unique to a superresolution phenomenon, occur on opposite sides of a focused beam spot as with the case of the conventional technique employing a shading band as described hereinbefore. The sidelobes present themselves in the form of signal noise, particularly, on reading signals recorded in optical discs, creating a cause for degradation in the quality of reproduced signals.

According to the conventional technique (reference: technical literature described hereinbefore), the sidelobes are shaded by disposing a slit at a position where signal light reflected from the focused spot is once focused by a focusing lens, and subsequently, a new focused spot with the sidelobes substantially removed is formed by disposing another focusing lens for further focusing.

However, to the extent that light is focused by another focusing lens, extra optical paths are required of an optical system, resulting in an increase in the number of components of the optical system, and a more complex construction thereof. Furthermore, in the case of displacement of the slit occurring, not only the sidelobes but also the focused spot will be shaded. Accordingly, delicate positioning of the slit is required. In addition, there can arise a problem of dust or the like being adhered to the gap of the slit. Further, even if the slit is disposed at a given position, occurrence of some sidelobes due to fresh diffraction of light taking place is unavoidable since light is shaded by the slit.

Accordingly, the invention has a construction wherein in the case of application, for example, to an optical apparatus for reading signals recorded in optical discs, more specifically, to an optical apparatus in which an optically reflective medium, that is, an optical disc, is disposed substantially at the focal point of a condensing optics and a light beam reflected from the optically reflective medium is caused to be condensed at a point other than the focal point of the condensing optics so that the condensed light beam is detected by an optical detection element, a linearly polarized light detection element for transmitting only a component of the linearly polarized light, oriented in a given direction, is disposed in the optical path of the light beam reflected from the optically reflective medium.

In this instance, by adjusting the direction in which a component of the linearly polarized light is transmitted through the linearly polarized light detection element so as to coincide with the direction in which sidelobes are removed from the linearly polarized light detected by the optical detection element, the linearly polarized light can be taken out after shading the sidelobes only.

As is evident from the formula (1) described in the foregoing, the theoretical resolution of an optical system is largely dependent on the numerical aperture thereof. The numerical aperture of an optical pickup in a common optical disc system is on the order of 0.45 for CDs (compact discs) and CDs-ROM, and on the order of 0.55 for DVDs (digital versatile discs). Therefore, common use of such an optical pickup for CDs and DVDs is not feasible.

Accordingly, various approaches to overcome this problem have been attempted such as the adoption of constructions whereby two of the optical pickup units are installed in one unit of an optical apparatus, a condensing lens of the optical pickup is caused to have two focal points by creating holograms therein, the diameter of the effective entrance pupil is changed over by use of a liquid crystal shutter, or the like.

However, installation of two units of the optical pickup in one unit of an optical apparatus makes the construction of the optical apparatus complex, leading to a higher cost thereof while with the focusing lens provided with two focal points by creating holograms therein, an unnecessary focused spot always occurs at either of the two focal points, deteriorating an optical utilization ratio. This will cause a problem for an optical system requiring a large amount of light such as DVDs-R, that is, writable and erasable DVDs. The same problem will arise in the case of the construction employing the liquid crystal shutter.

Accordingly, the optical apparatus according to the invention has a construction wherein a linearly polarized light detection element for substantially transmitting only a component of the linearly polarized light, transmitted through either of the $\theta°$ optically rotatable region or the $(\theta-90)°$ optically rotatable region, is disposed in the optical path of a light beam reflected from an optically reflective medium, that is, an optical disc, in the case that the optically reflective medium is disposed substantially at the focal point of the condensing optics and the light beam reflected from the optically reflective medium is caused to be focused at a point other than the focal point of the condensing optics so that the condensed light beam is detected by an optical detection element.

The construction described above presupposes that the optical rotatory element is constructed such that the same can be divided into the $\theta°$ optically rotatable region and the $(\theta-90)°$ optically rotatable region, or the $90°$ optically rotatable region and the optically unrotatable region, by means of electrical control so that changeover of numerical apertures as necessary depending on type of application can be attained by changeover of the function of the optical rotatory element. Consequently, high precision reproduction of information recorded in optical discs for both CDs and DVDs, having different numerical apertures, can be effected with ease. Furthermore, with the optical apparatus of the invention, the optical utilization ratio is high since no optical shield such as a polarizing plate is disposed in a light beam advancing towards the condensing optics for an optical disc. This is advantageous in writing information to the optical disc.

With the optical apparatus according to the invention, constructed such that at least the $90°$ optically rotatable region is turned so that the liquid crystal molecules are homeotropic in alignment by applying a voltage, the same effect of operation can be attained by disposing a linearly polarized light detection element for substantially transmitting only a component of the linearly polarized light, transmitted through either of the $90°$ optically rotatable region and the optically unrotatable region of the optical rotatory element, in the optical path of the light beam reflected from the optically reflective medium.

Further, with the optical apparatus according to the invention, constructed such that at least the entire region wherein the linearly polarized light falling on the $90°$ twisted-nematic liquid crystal element is transmitted, is set to be a $90°$ optically rotatable region while a portion of the $90°$ optically rotatable region is turned into the optically unrotatable region by causing the liquid crystal molecules of the same to become homeotropic in alignment by applying a voltage, the same effect of operation can be attained by disposing a linearly polarized light detection element for substantially transmitting only a component of the linearly polarized light, transmitted through either of the $90°$ optically rotatable region or the optically unrotatable region, in the optical path of the light beam reflected from the optically reflective medium.

BEST MODE FOR CARRYING OUT THE INVENTION

Now, referring to the accompanying drawings, embodiments of an optical apparatus according to the invention will be described in detail hereinafter.

Embodiment 1-A

Figure 1:
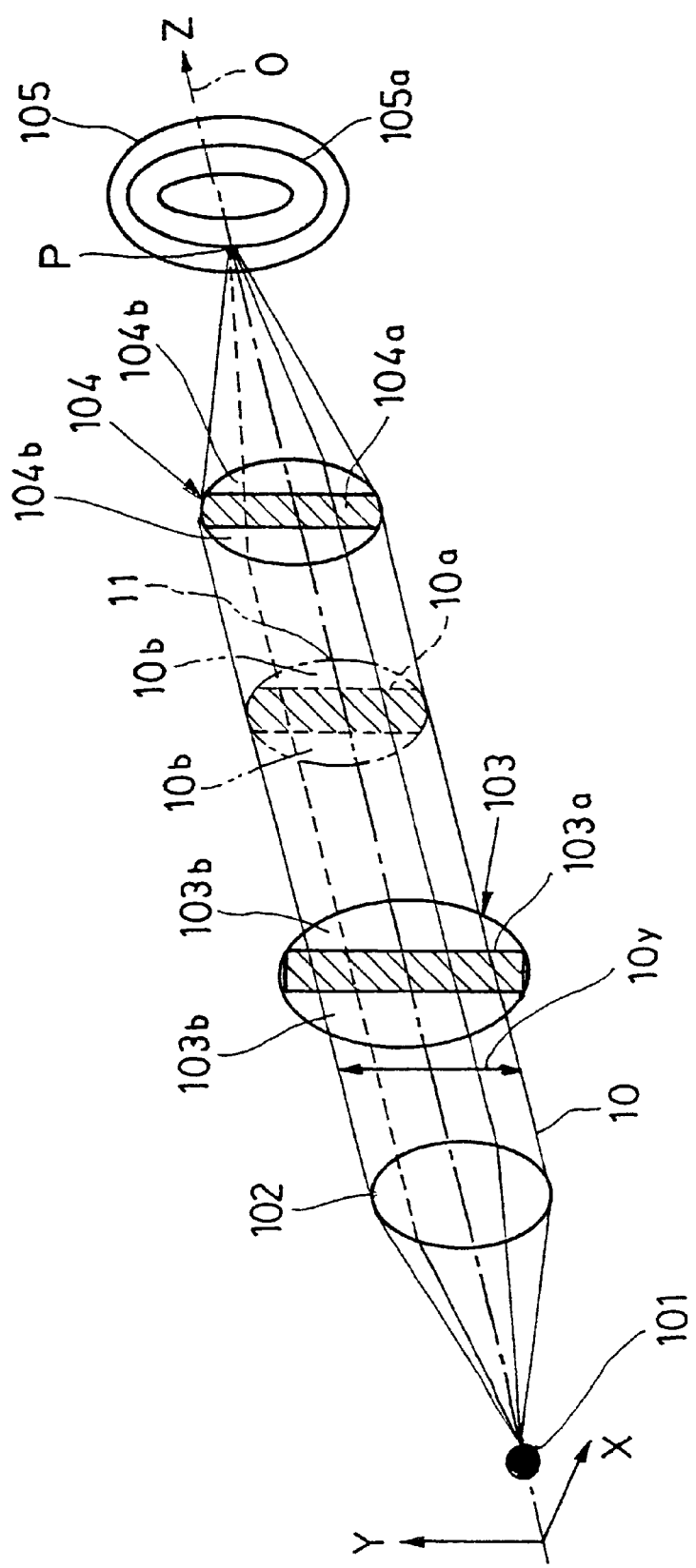
FIG. 1 is a schematic illustration showing embodiment 1-A of an optical apparatus according to the invention, as applied to an optical disc system.

FIG. 1 is a schematic illustration showing embodiment 1-A of an optical apparatus according to the invention, applied to an optical disc system.

In this embodiment, an optical system for the optical apparatus comprises a linearly polarized laser light source 101, a collimating lens 102, an optical rotatory element 103, and a focusing optics 104.

Linearly polarized light 10 emitted from the linearly polarized laser light source 101 is turned into plane waves by the collimating lens 102. In this instance, the linearly polarized light 10 is assumed to have a polarization axis $10y$ oriented in the direction of the y-axis.

When the linearly polarized light 10 is transmitted through the optical rotatory element 103, the direction of the polarization axis $10y$ is rotated due to the optical rotating power of the optical rotatory element 103. More specifically, the optical rotatory element 103 is composed of a region 103a wherein the linearly polarized light 10 falling thereon is rotated by θ in the direction of the x-axis crossing the y-axis at right angles, and regions 103b wherein the linearly polarized light 10 falling thereon is rotated by $(\theta-90)°$ in the direction described.

As indicated by hatching in FIG. 1, the region 103a for optically rotating the linearly polarized light 10 falling thereon by θ° is formed in an oblong shape centering around the optical axis. Consequently, linearly polarized light 10a transmitted through the region 103a for rotating the polarization of light by θ° falls on a region 104a substantially oblong in shape, centering around the optical axis O of the focusing optics 104. A light beam falling on the region 104a oblong in shape makes up a portion of an effective light beam 11 falling on the focusing optics 104. In FIG. 1, an aperture or the like for limiting the light beam falling on the focusing optics 104 is not used, and consequently, the effective light beam 11 coincides with the beam of the linearly polarized light 10 transmitted through the optical rotatory element 103.

Meanwhile, linearly polarized light 10b transmitted through the regions 103b for rotating the polarization of light by $(\theta-90)°$ falls on regions 104b of the focusing optics 104, other than the oblong region 104a.

In this instance, the polarization axis of the linearly polarized light 10a falling on the oblong region 104a intersects that of the linearly polarized light 10b falling on the regions 104b, other than the oblong region 104a, at right angles. As a portion of the oblong region 104a, in the x-axis direction, covers a portion of the effective light beam 11, a supperresolved image is formed for an x-axis component of the effective light beam 11 at a beam spot P formed by the focusing optics 104.

Accordingly, when recording information on an optical disc 105, a spacing between spiral recording grooves 105a of the optical disc 105, namely, a track pitch, can be reduced by disposing the optical disc 105 at the position of the beam spot P as well as by orienting the tangent line of the each spiral recording groove 105a so as to cross the x-axis at right angles thereby enabling enhancement in recording density.

For the optical disc system shown in FIG. 1, the optical rotatory element 103 is disposed in front of the focusing optics 104. However, the same optical effect can be obtained even by disposing the optical rotatory element 103 behind the focusing optics 104.

However, in the case that the optical rotatory element 103 is disposed behind the focusing optics 104, it is desirable to dispose the optical rotatory element 103 as close to the focusing optics 104 as possible. More specifically, the optical rotatory element 103 may be disposed at or close to the position of the entrance pupil of the focusing optics 104. The position of the entrance pupil of an optical system can generally be determined on the basis of geometrical optics. For example, in the case of an optical system for optical disc systems, a single lens is normally used for the condensing optics, and consequently, the position of the entrance pupil will be substantially adjacent to the surface on the incident side of the lens.

Further, if the optical rotatory element 103 is formed in such a shape as parallel plane plates causing no optical phase distribution, the aberration of the optical system will not be adversely affected since the optical rotatory element 103 is disposed within a parallel light beam. In case that there is a possibility of the optical rotatory element 103 affecting the aberration of the optical system due to the construction of the optical system, wherein the optical rotatory element 103 is inserted, the focusing optics 104 may be designed taking Into consideration the existence of the optical rotatory element 103, or the optical rotatory element 103 may be provided with an optical phase distribution for compensating for the aberration.

For the optical disc system shown in FIG. 1, the region 103a of the optical rotatory element 103, for rotating the polarization of light by $\theta°$, is formed in an oblong shape. However, the same may be formed in a circular shape centering around the optical axis. In this case, superresolved images will be formed with respect to components of the effective light beam, in the directions of both the x-axis and y-axis. Furthermore, the region 103a for rotating the polarization of light by $\theta°$ need not be formed in an exact oblong or circular shape. Similar superresolved images may be formed with the region 103a having some notches or warps. In addition, even if the center of the region 103a is somewhat off the optical axis of the optical system, sufficiently superresolved images may be similarly formed.

Embodiment 1-B

Figure 2:
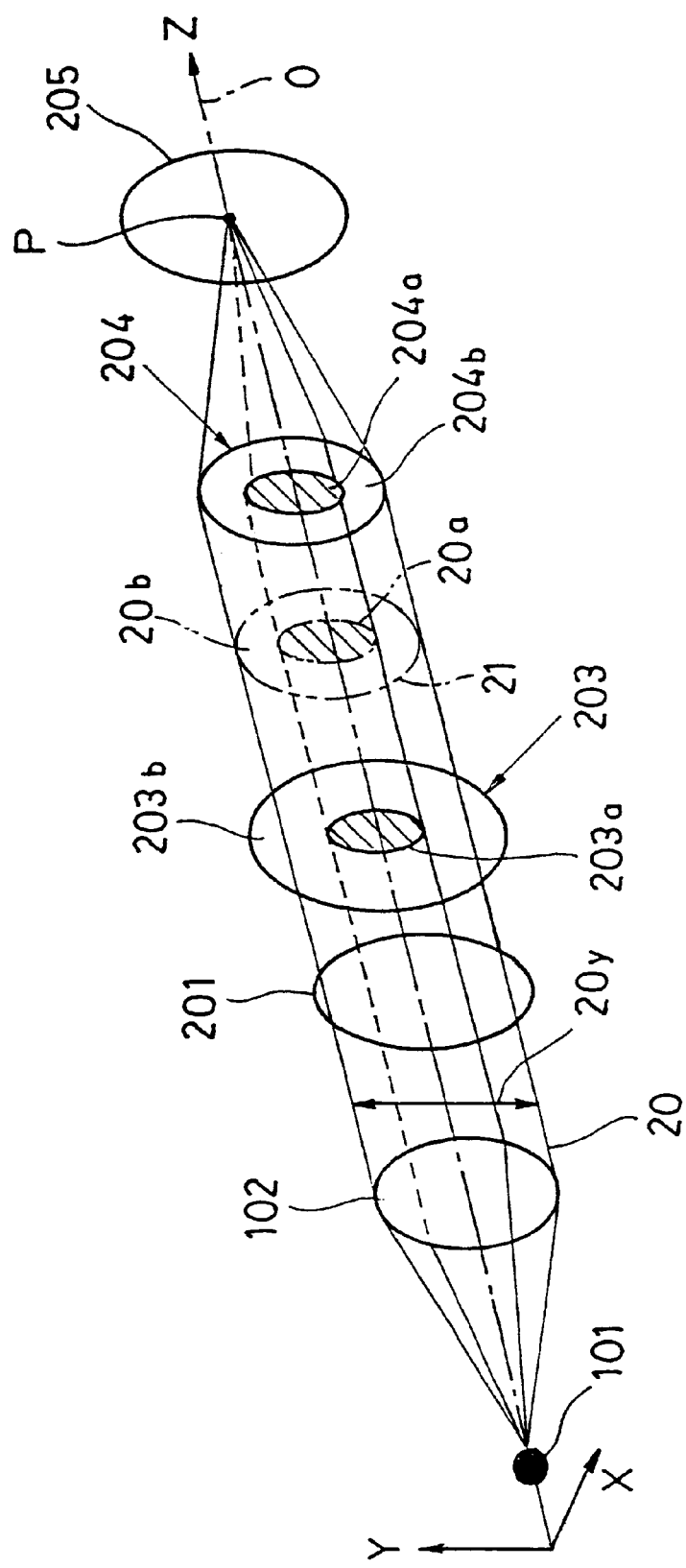
FIG. 2 is a schematic illustration showing embodiment 1-B of an optical apparatus according to the invention, as applied to a lithographic masking system.

FIG. 2 is a schematic illustration showing embodiment 1-B of an optical apparatus according to the invention, as applied to a photolithographic masking system. As is well known, the photolithographic masking system is used for printing circuit patterns or the like on LSI (large scale integrated circuit) substrates or glass substrates for a liquid crystal layer.

In FIG. 2, parts corresponding to those previously described with reference to FIG. 1 are denoted by the same reference numerals. In the optical system shown in FIG. 2, an image forming optics 204 is adopted for the condensing optics, and a pattern formed on a photo mask 201 is projected on an exposure substrate 205 by the image forming optics 204. Further, in the optical system shown in FIG. 2, a region 203a of an optical rotatory element 203, for rotating the polarization of light by $\theta°$, is formed in a circular shape centering around the optical axis of the optical system.

Consequently, linearly polarized light 20a optically rotated by $\theta°$ falls on a circular region 204a centering around the optical axis of the image forming optics 204. As a result, components of the linearly polarized light, oriented in the direction of the x-axis and y-axis, respectively, which cross each other at right angles, will be able to form superresolved images on the exposure substrate 205.

More specifically, linearly polarized light 20 which is emitted from the linearly polarized laser light source 101 and turned into plane waves by a collimating lens 102 is transmitted through the photo mask 201, and falls on the optical rotatory element 203, In this case, the linearly polarized light 20 is assumed to have the polarization axis 20y oriented in the direction of the y-axis.

The direction of the polarization axis 20y of the linearly polarized light 20 is rotated due to the optical rotating power of the optical rotatory element 203. The optical rotatory element 203 is composed of a region 203a wherein the linearly polarized light 20 falling thereon is rotated by $\theta°$ in the direction of the x-axis crossing the y-axis at right angles, and a region 203b wherein the linearly polarized light 20 falling thereon is rotated by $(\theta-90)°$ in the direction described. The region 203a for rotating the polarization of light by $\theta°$ is formed in a circular shape centering around the optical axis as described above.

Linearly polarized light 20a transmitted through the region 203a of the optical rotatory element 203 for rotating the polarization of light by $\theta°$ and rotated by $\theta°$ in the direction of the x-axis falls on a circular region 204a centering around the optical axis O of the image forming optics 204.

The circular region 204a corresponds to the portion of an effective light beam 21 falling on the image forming optics 204. In FIG. 2, an aperture or the like for limiting the light beam falling on the image forming optics 204 is not used, and consequently, the effective light beam 21 coincides with the beam of the linearly polarized light 20 transmitted through the optical rotatory element 203.

Meanwhile, linearly polarized light 20b transmitted through the region 203b for rotating the polarization of light by $(\theta-90)°$ falls on a region 204b of the image forming optics 204, other than the circular region 204a.

In this instance, the polarization axis of the linearly polarized light falling on the circular region 204a intersects that of the linearly polarized light falling on the region 204b, other than the circular region 204a, at right angles. As a result, both components of the effective light beam 21, oriented in the direction of the x-axis and the y-axis, respectively, are able to form superresolved images on the exposure substrate 205.

For the photolithographic masking system shown in FIG. 2 as well, the optical rotatory element 203 may be alternatively disposed behind the image forming optics 204. If the optical rotatory element 203 is formed in such a shape as parallel plane plates causing no optical phase distribution, the aberration of the optical system will not be adversely affected because the optical rotatory element 203 is disposed in a collimated light beam.

Embodiment 1-C

Figure 3:
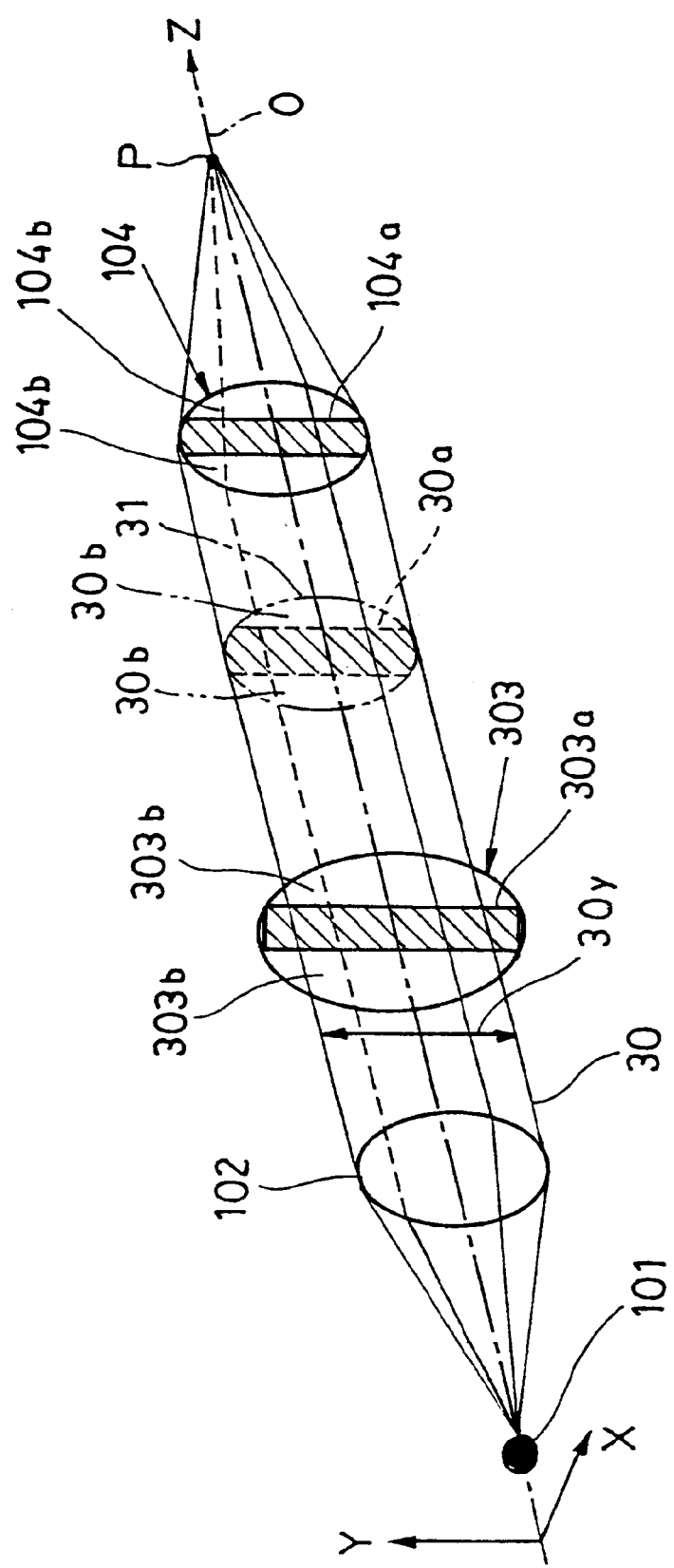
FIG. 3 is a schematic illustration showing embodiment 1-C of an optical apparatus according to the invention, using twisted-nematic liquid crystals for an optical rotatory element.

FIG. 3 is a schematic illustration showing embodiment 1-C of an optical apparatus according to the invention, wherein twisted nematic liquid crystals are employed for an optical rotatory element.

With the use of the optical system shown in the figure, it is possible to construct a superresolving optical apparatus capable of forming a micro-beam spot exceeding the theoretical resolution limit of the optical system.

First, the optical rotatory function of the twisted nematic liquid crystals will be briefly described hereinafter to facilitate understanding of the optical system shown in the figure.

Figure 4A:
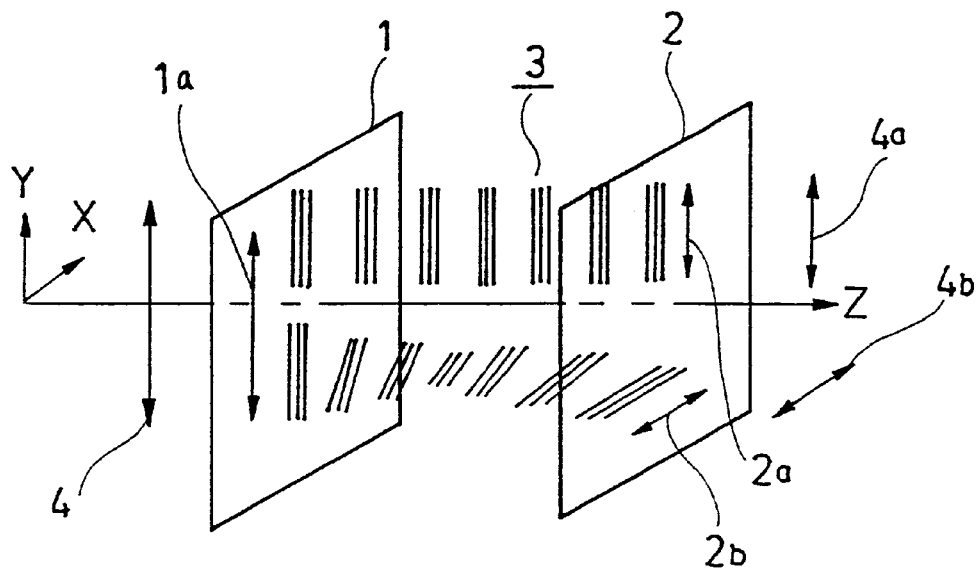
FIGS. 4A, and 4B are views schematically showing the optical rotation property of a common twisted-nematic liquid crystal element which can be electrically controlled.
Figure 4B:
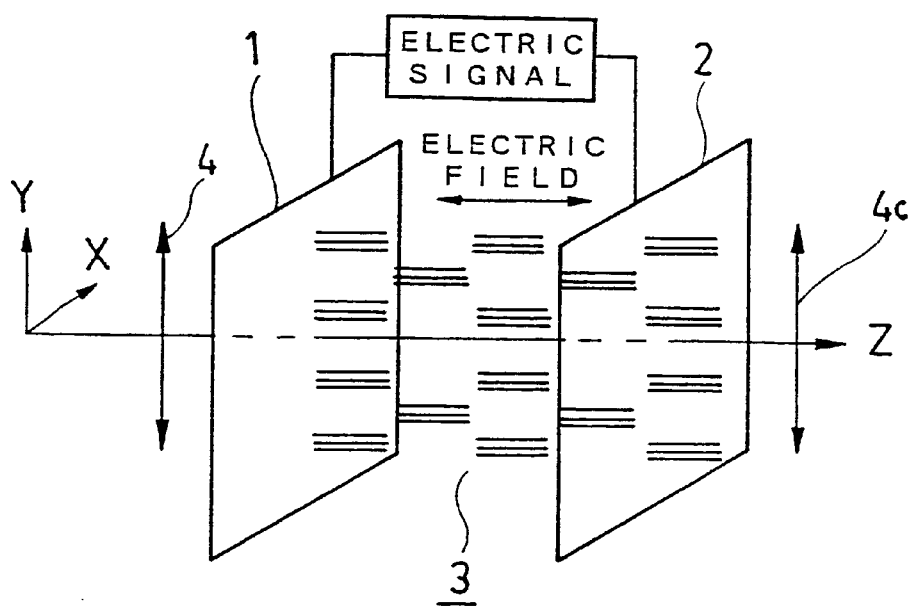

FIGS. 4A and 4B are schematic representations illustrating the optical rotatory function of a common twisted nematic liquid crystal element which can be controlled electrically.

As shown in FIG. 4A, the twisted nematic liquid crystal element is constructed such that liquid crystal molecules 3 are filled in between glass substrates 1 and 2 each coated with transparent electrodes. The glass substrate 1 on the incident light side has an alignment axis 1a oriented in the direction of the y-axis while the glass substrate 2 on the outgoing light side has, for example, an alignment axis 2a oriented in the direction of the y-axis in the upper half of the region thereof, and an alignment axis 2b oriented in the direction of the x-axis crossing the y-axis at right angles in the lower half of the region thereof.

The liquid crystal molecules 3 have properties of orienting long axes thereof in the direction of the alignment axes as well as behaving as a continuum. As shown in FIG. 4A, the liquid crystal molecules 3 are aligned parallel with each other in the upper half of the region of the glass substrate 2 on the outgoing light side owing to such properties. This state is called 'homogeneous'. Meanwhile, the liquid crystal molecules 3 in the lower half of the region are rotated gradually and smoothly by 90°. This state is called '90° twisted nematic'.

When linearly polarized incoming light falls on a twisted nematic liquid crystal element having such properties as described above, rotation of the polarization axis 4 of the linearly polarized light falling thereon will propagate such that the polarization axis thereof will be eventually aligned with the direction of the long axes of the liquid crystal molecules 3 owing to dielectric anisotropy of the liquid crystal molecules. That is, the polarization axis of linearly polarized outgoing light is oriented in the direction 4a along the y-axis in the upper half region, and in the direction 4b along the x-axis in the lower half region, thereby crossing each other at right angles.

Now, provided that the refractive index of the liquid crystal molecules, in the direction of long axes thereof, is designated n1, and the same in the direction of short axes thereof n2, and the thickness of liquid crystal layer is d, an optical path length of linearly polarized incoming light advancing in the liquid crystal layer can be generally expressed for both the upper and lower half regions by a formula n1×d. To be exact, when the polarization axis 4 of the linearly polarized light falling thereon coincides with the direction of the alignment axis 1a of the liquid crystal molecules on the incoming light side (that is, the long axes of the liquid crystal molecules), and a condition, wherein the result of the following formula is the square root of either of 3, 15, 35, and so on, is satisfied, the linearly polarized incoming light outgoes as linearly polarized light:

$$2\times(n1-n2)\times d \div \qquad (2)$$

where λ=a wavelength of incoming light.

In practice, however, no particular problem arises even if the wavelength of light used, the refractive index of the liquid-crystal molecules, and the thickness of the liquid crystal layer do not exactly satisfy the condition expressed by the formula described above. It is also possible to make necessary adjustment by slightly deviating the direction of the polarization axis 4 of the linearly polarized incoming light from the direction of the alignment axis 1a on the incoming light side.

Next, when an electric field in the direction of the z-axis (direction of light propagation) is applied to the liquid crystal element via the glass substrates 1 and 2 coated with the transparent electrodes, the long axes of the liquid-crystal molecules 3 become aligned in the direction of the z-axis, which is the direction of the electric field, and come to rest as shown in FIG. 4B. This state is called 'homeotropic'.

With the liquid crystal molecules 3 in the 'homeotropic' state, the polarization axis 4c of linearly polarized outgoing light will be oriented in the same direction as that of the polarization axis 4 of the linearly polarized incoming light, namely, the y-axis. That is, the optical rotating power will be lost. Then, the optical path length of the linearly polarized incoming light advancing through the liquid crystal layer becomes n2×d.

In the embodiment of the invention shown in FIG. 3, a twisted-nematic liquid crystal element 303 having such properties as described above is employed for the optical rotatory element. In FIG. 3, parts corresponding to those previously described with reference to FIG. 1 are denoted by the same reference numerals.

In the optical system shown in FIG. 3, the direction of the alignment axis of the liquid crystal element 303 on the side where linearly polarized light 30 falls is set to substantially coincide with the direction of the polarization axis 30y of the linearly polarized light 30 falling on the liquid crystal element, both being oriented in the direction of the y-axis.

The linearly polarized light 30 emitted from a linearly polarized laser light source 101, and turned into plane waves by a collimating lens 102, falls on the liquid crystal element 303. The liquid crystal element 303 is composed of a homogeneous region 303a and 90° twisted-nematic regions 303b.

In this embodiment, the homogeneous region 303a is formed in an oblong shape centering around the optical axis O. The length of the homogeneous region 303a, along the y-axis direction, is set to cover a beam region of the linearly polarized light 30 while the width thereof, along the x-axis direction, is set to cover a part of the beam region of the linearly polarized light 30.

The linearly polarized light 30 which has fallen on the homogeneous region 303a of the liquid-crystal element 303 is transmitted therethrough without being optically rotated. Then, a linearly polarized light 30a transmitted through the homogeneous region 303a falls on a substantially oblong region 104a centering around the optical axis O of the focusing optics 104.

In this instance, the oblong region 104a corresponds to a portion of an effective light beam 31 falling on the focusing optics 104. Further, in FIG. 3, since a stop or the like for limiting the light beam falling on the focusing optics 104 is not employed, the effective light beam 31 coincides with the beam of the linearly polarized light 30 transmitted through the liquid crystal element 303. Consequently, there will be no loss in light amount, and the effective light beam 31 passing through the focusing optics 104 is focused at a point P, forming a beam spot.

Meanwhile, a linearly polarized light 30b transmitted through the 90° twisted-nematic region 303b is optically rotated by 90°, and falls on regions 104b of the focusing optics 104, other than the oblong region 104a.

Polarization axes of the linearly polarized light falling on the oblong region 104a and the same falling on the regions 104b, other than the oblong region 104a, cross each other at right angles. Consequently a superresolved image is formed for a light component oriented in the x-axis direction at the beam spot produced by the focusing optics 104.

Figure 5:
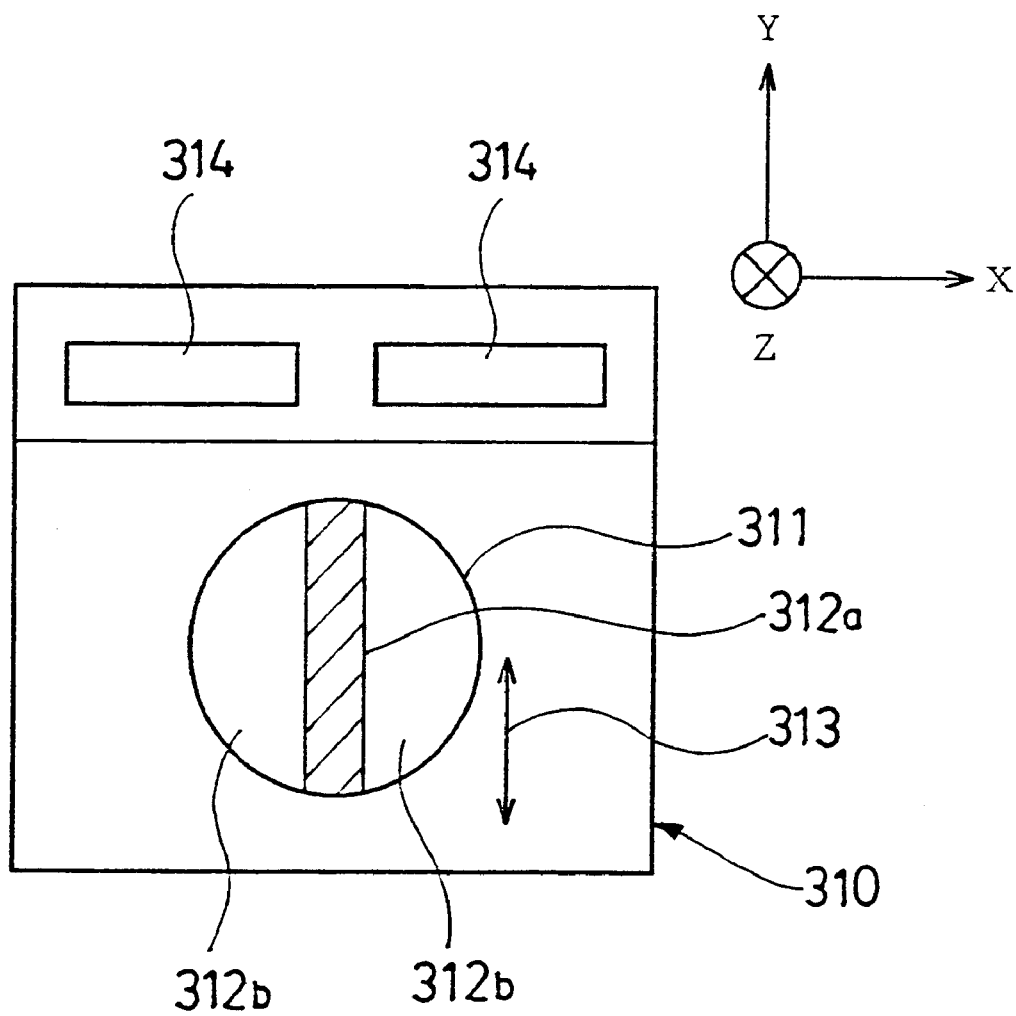
FIG. 5 is a view showing the construction of a twisted-nematic liquid crystal element manufactured by the inventor on an experimental basis in carrying out embodiment 1-C.

FIG. 5 is a view showing the construction of a twisted-nematic liquid crystal element manufactured by the inventor on an experimental basis in carrying out embodiment 1-C.

The liquid crystal element 310 shown in the figure has a external shape about 15 mm square, and is provided with a region 311 for sealing in liquid crystals, 10 mm in diameter, at the center thereof. A homogeneous region 312a, 1 mm in width and substantially oblong in shape, is formed in the center area of the region 311 for sealing in the liquid crystals, and 90° twisted-nematic regions 312b are formed in the rest of the region 311.

The direction of an alignment axis 313 of liquid crystal molecules on the side of incoming light coincides with that of the long sides of the homogeneous region 312a, which is oblong in shape and this direction is designated the y-axis. The optical axis is extended in the direction of the z-axis, perpendicular to the plane of the drawing. Electrodes 314, 314 are provided in the upper part of the liquid-crystal element, and the entire region 311 for filling in the liquid crystals can be turned homeotropic by applying a sufficient external voltage to the electrodes. Further, with reference to the previously described formula (2), the liquid crystal element substantially satisfies the condition that the result of the formula should be nearly the square root of 15 with respect to light at a wavelength of 633 nm.

In the optical system actually employed, the beam of linearly polarized light 30 was in the shape of a circle about 5 mm in diameter, and as the focusing optics 104, a lens with a focal length at 500 mm was disposed about 5 cm away from the liquid crystal element 303.

Figure 6A:
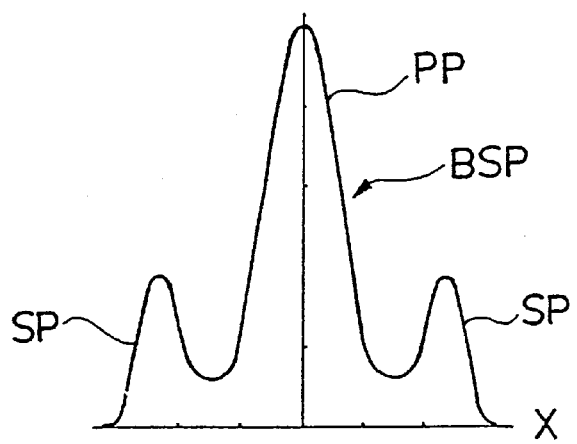
FIG. 6A is a chart showing a beam spot profile in the direction of the x-axis formed at a point P in embodiment 1-C.
Figure 6B:
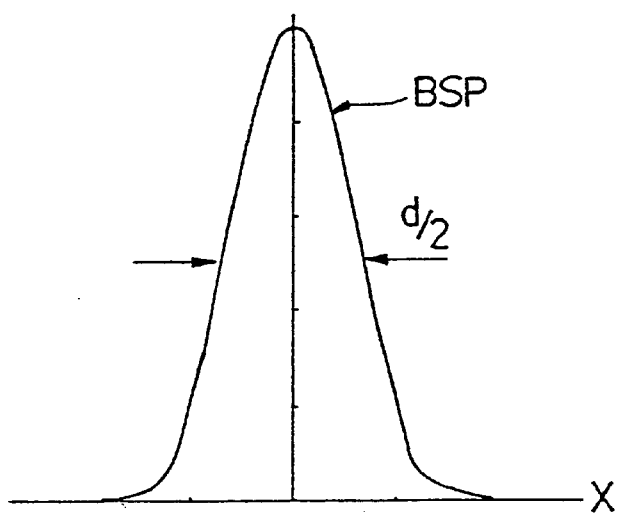
FIG. 6B is a chart showing a beam spot profile in the direction of the x-axis formed at a point P in an optical system according to embodiment 1-C wherein a liquid crystal element is removed.

FIG. 6A shows the profile in the x-axis direction of the beam spot formed at the point P in carrying out embodiment 1-C. FIG. 6B shows the beam spot profile in the x-axis direction at the point P when the optical system according to embodiment 1-C has a construction without the liquid crystal element 303.

A half width value d/2 of peak profile PP occurring in the center of the beam spot shown in beam spot profile BSP in FIG. 6A is seen narrower by about 15% than that shown in beam spot profile BSP in FIG. 6B, indicating formation of a superresolved image. The beam spot profile BSP in FIG. 6A shows that sidelobes SP occurred on the opposite sides of the peak profile PP formed at the center.

Figure 6C:
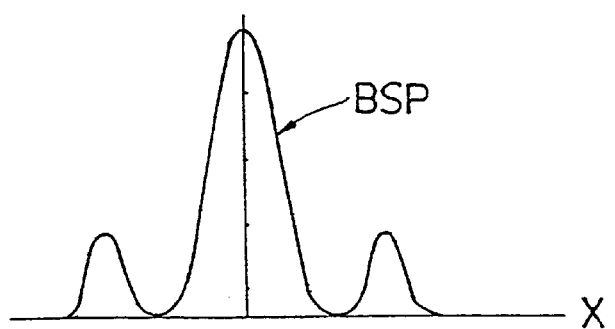
FIG. 6C is a chart showing a beam spot profile in the direction of the x-axis formed at a point P in an optical system according to embodiment 1-C wherein the liquid crystal element is removed, and instead, a shading band is disposed in the central region of a condensing optics.

FIG. 6C shows a beam spot profile BSP in the x-axis direction at the point P when the optical system according to embodiment 1-C is constructed without the liquid crystal element 303, but is provided with an oblong shielding plate, 1 mm wide in the x-axis direction and 10 mm long in the y-axis direction, disposed in the central region of the focusing optics 104 (that is, the construction of the conventional apparatus).

It was found by checking the optical utilization ratio that in embodiment 1-C, about a 1 5% loss of light power due to the presence of the liquid crystal element 303 was observed (refer to FIGS. 6A and 6B). However, it is possible to reduce the light power loss to not more than 10% by applying non-reflective coating to the glass substrates of the liquid crystal element.

On the other hand, with the construction of the conventional apparatus employing the shielding plate as described above, light power loss amounting to as much as about 40% was observed (refer to FIGS. 6A and 6C).

Further, with the construction according to embodiment 1-C, when the entire region of the liquid crystal element 303 was turned homeotropic in the z-axis direction by applying a voltage thereto, the beam spot profile at the point P substantially coincided with that shown in FIG. 6B. This is due to a lack of optical rotation of the polarization axis (refer to FIG. 4B). That is, with the construction of embodiment 1-C, a superresolved image as well as a normally resolved image can be formed at will and with ease by controlling the voltage applied to the liquid crystal element 303.

Further, even in the case of realizing a superresolved image, the superresolution effect was enhanced by applying an adequate bias voltage to the liquid crystal element 303 beforehand. It appears that this is attributable to a more efficient occurrence of a phenomenon of optical rotation due to reduced birefringence by applying a bias voltage close to a voltage at which the liquid crystals are activated.

With reference to the construction of embodiment 1-C, the homogeneous region 303a of the liquid crystal element 303 functions as a region For preventing the polarization axis of the linearly polarized light from being optically rotated. Such a function may be achieved by not forming a liquid crystal layer in the region. In this case, however, there is a risk of phase modulation occurring to the linearly polarized light falling thereon because of a difference in the optical path length occurring between the region with the liquid crystal layer and the same without the liquid crystal layer. Accordingly, there will be a need in this case for compensating for the phase modulation by use of the focusing optics 104, or other optics.

Also, with the construction of embodiment 1-C, wherein the homogeneous region 303a of the liquid crystal element 303 is turned into a θ° twisted-nematic region, and the 90° twisted-nematic region 303b into a (θ−90)° twisted-nematic region, a superresolved image can be formed as well because the polarization axes of the linearly polarized light passing through respective regions cross each other at right angles.

Embodiment 2-A

Figure 7:
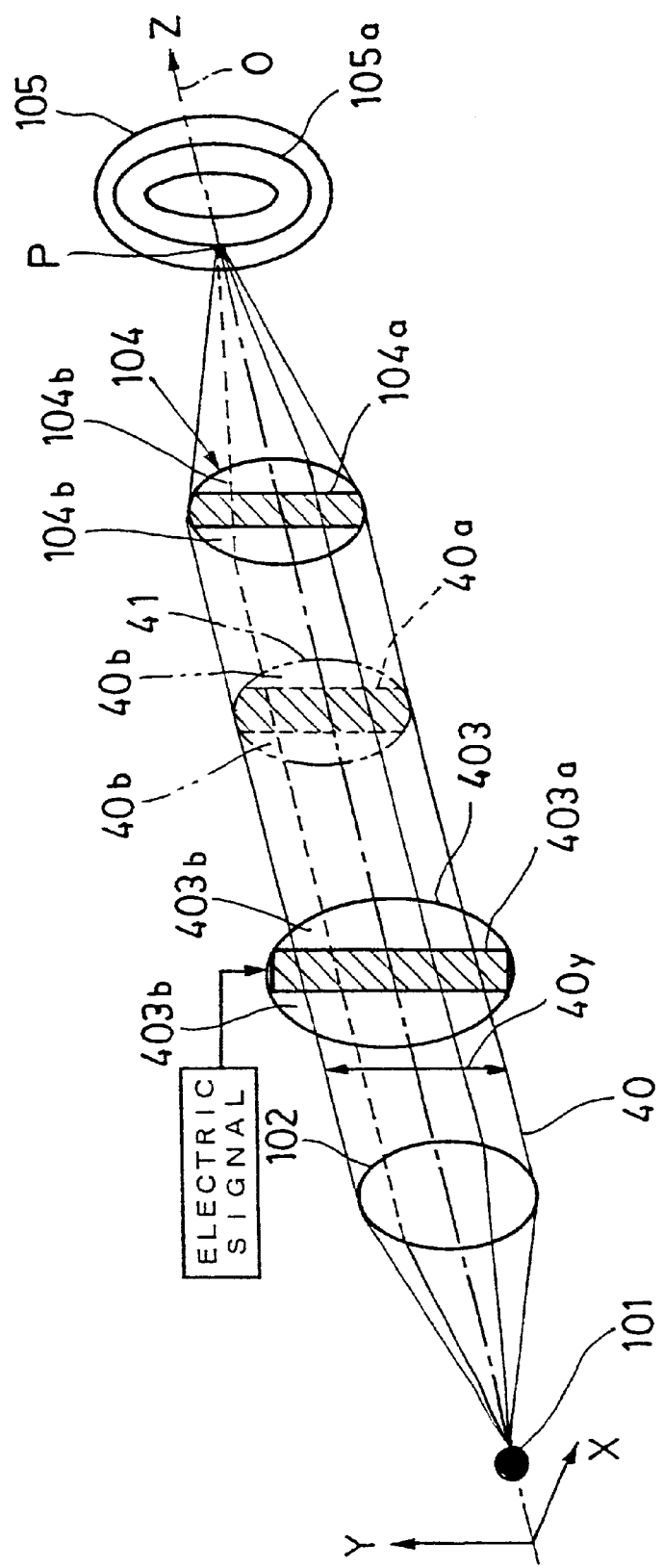
FIG. 7 is a schematic illustration showing embodiment 2-A of an optical apparatus according to the invention, as applied to an optical disc system.

FIG. 7 is a schematic illustration showing embodiment 2-A of an optical apparatus according to the invention, as applied to an optical disc system. In this figure, parts corresponding to those previously described with reference to FIG. 1 are denoted by the same reference numerals.

In this embodiment, an optical system for the optical appratus comprises a linearly polarized laser light source 101, a collimating lens 102, an optical rotatory element 403, and a focusing optics 104.

Linearly polarized light 40 emitted from the linearly polarized laser light source 101 is turned into plane waves by the collimating lens 102. In this case, the linearly polarized light 40 is assumed to have a polarization axis 40y oriented in the direction of the y-axis.

The optical rotatory element 403, in a state where no voltage is applied thereto, has an optical rotating power of rotating the polarization axis 40y of the linearly polarized light 40 falling thereon by 90° in the direction of the x-axis crossing the y-axis at right angles. A portion of the region for the optical rotatory element 403 makes up an optical unrotatable region 403a wherein the optical rotating power disappears when a voltage is applied thereto. Hence, the optical rotatory element 403 is functionally divided into the optical unrotatable region 403a and 90° optical rotatory regions 403b by applying a voltage thereto.

When the linearly polarized light 40 transmitted through the collimating lens 102 falls on the optical rotatory element 403 in a state where a voltage is applied to the optical unrotatable region 403a, the polarization axis 40y of the linearly polarized light 40 is rotated by 90° in the direction of the x-axis only in the 90° optical rotatory regions 403b.

As indicated by hatching in FIG. 7, the optical unrotatable region 403a is formed in an oblong shape centering around the optical axis O. Accordingly, linearly polarized light 40a transmitted through the optical unrotatable region 403a falls on a substantially oblong region 104a centering around the optical axis O of the focusing optics 104. The oblong region 104a corresponds to a portion of an effective light beam 41 falling on the focusing optics 104. Further, in FIG. 7, since a stop or the like for limiting a light beam falling on the focusing optics 104 is not employed, the effective light beam 41 coincides with the beam of the linearly polarized light 40 transmitted through the optical rotatory element 403.

Meanwhile. linearly polarized light 40b whose polarization axis has been rotated by 90° after being transmitted through the 90° optical rotatory regions 403b falls on regions 104b of the focusing optics 104, other than the oblong region 104a.

The polarization axis of the linearly polarized light falling on the oblong region 104a crosses that of the linearly polarized light falling on the regions 104b, other than the oblong region 104a, at right angles. Further, as a portion of the effective light beam 41 is blocked in the direction of the x-axis in the oblong region 104a, a superresolved image is formed for a component of the linearly polarized light, oriented in the direction of the x-axis, at a beam spot P produced by the focusing optics 104.

Therefore, when recording information into an optical disc 105, a track pitch, that is, a spacing between each spiral recording groove 105a of the optical disc 105 can be reduced by disposing the optical disc 105 at the position of the beam spot P, and by setting the tangent line of the each spiral recording groove 105a in the direction crossing the x-axis at right angles, the recording density can be enhanced.

Further, by controlling a voltage applied to the optical unrotatable region 403a, changeover between a superresolved image and an ordinarily resolved image can be effected with ease.

For the optical disc system shown in FIG. 7, the optical rotatory element 403 is disposed in front of the focusing optics 104. However, the same effect can be attained by disposing the optical rotatory element 403 in the back of the focusing optics 104.

However, in the case that the optical rotatory element 403 is disposed behind the focusing optics 104, it is desirable to dispose the optical rotatory element 403 as close to the focusing optics 104 as possible. More specifically, the optical rotatory element 403 may be disposed at or close to the position of the entrance pupil of the focusing optics 104. The position of the entrance pupil of an optical system is generally determined on the basis of geometrical optics. For example, in the case of an optical system for optical disc systems, wherein a single lens is normally used for the focusing optics, the position of the entrance pupil will be substantially adjacent to the surface on the incidence side of the lens.

Further, if the optical rotatory element 403 is formed in such a shape as parallel plane plates causing no optical phase distribution, the aberration of the optical system will not be adversely affected since the optical rotatory element 403 is disposed within a collimated light beam. In the event that there is a possibility of the optical rotatory element 403 affecting the aberration of the optical system due to the construction of the optical system wherein the optical rotatory element 403 is inserted, the focusing optics 104 may be designed taking into consideration the existence of the optical rotatory element 403, or the optical rotatory element 403 may be provided with an optical phase distribution for compensating for the aberration.

For the optical disc system shown in FIG. 7, the optical unrotatable region 403a of the optical rotatory element 403 is formed in an oblong shape, however, the same may be formed in a circular shape centering around the optical axis. In this case, superresolved images will be formed for components of the effective light beam, in the directions of both the x-axis and y-axis. Further, the optical unrotatable region 403a need not be formed in an exact oblong, or circular shape. With the optical unrotatable region 403a having some notches or distortions, similar superresolved images may be formed. Furthermore, even if the center of the region 403a is somewhat off the optical axis of the optical system, sufficiently superresolved images may be similarly formed.

It is also possible to turn the optical unrotatable region 403a shown in FIG. 7 into a 90° optical rotatory region, and the 90° optical rotatory regions 403b shown in the figure into optical unrotatable regions. In such a case, the polarization axes of linearly polarized light transmitted through the respective regions cross each other at right angles when a voltage is applied only to what have been turned into the optical unrotatable regions, enabling formation of superresolved images.

Embodiment 2-B

Figure 8:
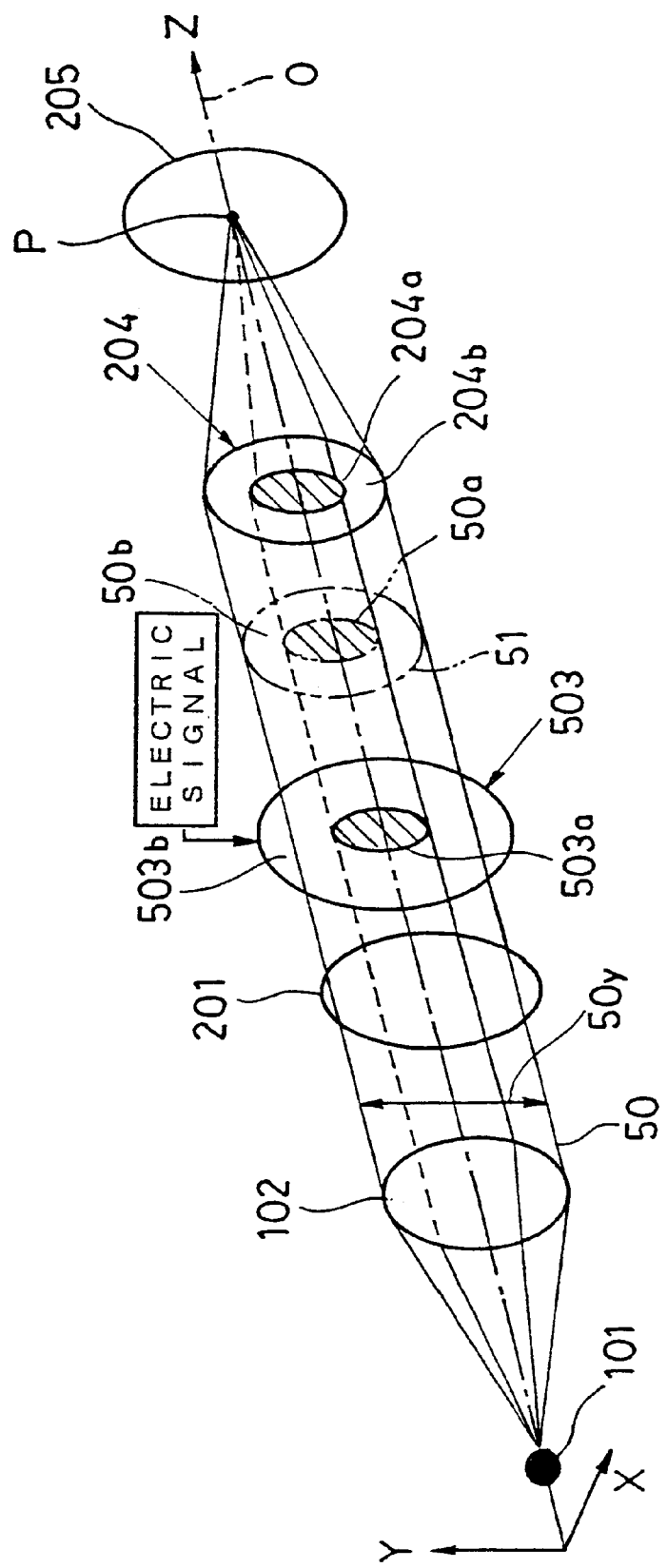
FIG. 8 is a schematic illustration showing embodiment 2-B of an optical apparatus according to the invention, as applied to a lithographic masking system.

FIG. 8 is a schematic illustration showing embodiment 2-B of an optical apparatus according to the invention, as applied to a photolithographic masking system.

As is well known, the photolithographic masking system is used for printing circuit patterns or the like on LSI (large scale integrated circuit) substrates or glass substrates of a liquid crystal element.

In FIG. 8, parts corresponding to those previously described with reference to FIG. 2 are denoted by the same reference numerals. In the optical system shown in FIG. 8, an image forming optics 204 is adopted for a focusing optics, and a pattern formed on a photo mask 201 is projected on an exposure substrate 205 by the image forming optics 204. Further, in the optical system shown in FIG. 8, an optical unrotatable region 503a of an optical rotatory element 503 is formed in a circular shape centering around the optical axis. Consequently, linearly polarized light 50a transmitted through the optical unrotatable region 503a falls on a circular region 204a centering around the optical axis O of the image forming optics 204. As a result, superresolved images can be formed on the exposure substrate 205 for components of the linearly polarized light, oriented in the direction of the x-axis and y-axis, respectively, crossing each other at right angles.

That is, linearly polarized light 50 emitted from the linearly polarized laser light source 101 and turned into plane waves by a collimating lens 102 is transmitted through a photo mask 201, and falls on the optical rotatory element 503, In this case, the linearly polarized light 50 is assumed to have the polarization axis 50y oriented in the direction of the y-axis.

The optical rotatory element 503, in a state where no voltage is applied thereto, has an optical rotating power of rotating the polarization axis 50y of the linearly polarized light 50 falling thereon by 90° in the direction of the x-axis crossing the y-axis at right angles. A portion of the region for the optical rotatory element 503 makes up an optical unrotatable region 503a where the optical rotating power disappears when a voltage is applied thereto. Consequently, the optical rotatory element 503 is functionally divided into the optical unrotatable region 503a and a 90° optical rotatory region 503b by applying a voltage to the optical unrotatable region 503a.

When the linearly polarized light 50 transmitted through the collimating lens 102 falls on the optical rotatory element 503 in a state where a voltage is applied to the optical unrotatable region 503a, the polarization axis 50y of the linearly polarized light 50 is rotated by 90° in the direction of the x-axis in the 90° optical rotatory region 503b only.

Linearly polarized light 50a (without the polarization axis thereof being rotated) transmitted through the optical unrotatable region 503a of the optical rotatory element 503 falls on a circular region 204a centering around the optical axis O of the image forming optics 204. The circular region 204a corresponds to the portion of an effective light beam 51 falling on the image forming optics 204. Further, in FIG. 8, since a stop or the like for limiting a light beam falling on the image forming optics 204 is not employed. the effective light beam 51 coincides with the beam of the linearly polarized light 50 transmitted through the optical rotatory element 503.

Meanwhile, a linearly polarized light 50b (with the polarization axis thereof rotated by 90° in the x-axis direction) transmitted through the 90° optically rotatory regions 503b falls on a region 204b of the image forming optics 204, other than the circular region 204a.

The polarization axis of the linearly polarized light falling on the circular region 204a crosses that of the linearly polarized light falling on the region 204b, other than the circular region 204a, at right angles, As a result, a superresolved image is formed on the exposure substrate 205 for components of the effective light beam, oriented in the direction of the x-axis and the y-axis crossing each other at right angles, respectively.

In this embodiment 2-B of the invention as well, changeover between a superresolved image and an ordinarily resolved image can be effected with ease by controlling a voltage applied to the optical unrotatable region 503a.

For the photolithographic masking system shown in FIG. 8 as well, the optical rotatory element 503 may be disposed behind the image forming optics 204. If the optical rotatory element 503 is formed in such a shape as parallel plane plates causing no optical phase distribution, the aberration of the optical system will not be adversely affected since the optical rotatory element 503 is disposed in a collimated light beam.

Embodiment 2-C

Figure 9:
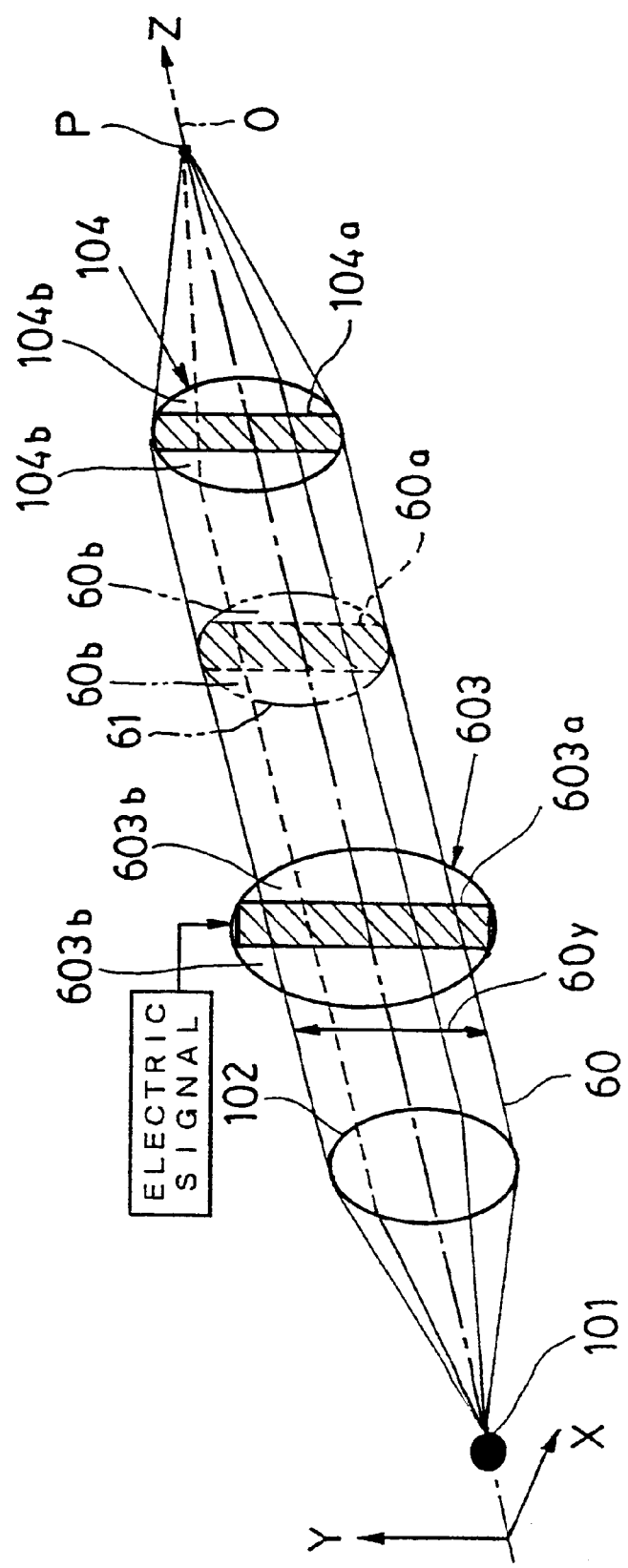
FIG. 9 is a schematic illustration showing embodiment 2-C of an optical apparatus according to the invention, using twisted-nematic crystals for an optical rotatory element.

FIG. 9 is a schematic illustration showing embodiment 2-C of an optical apparatus according to the invention, wherein twisted nematic liquid crystals are employed for an optical rotatory element. In FIG. 9, parts corresponding to those previously described with reference to FIG. 7 are denoted by the same reference numerals.

With an optical system shown in FIG. 9. it is possible to construct a superresolving optical apparatus capable of forming a micro-beam spot exceeding the theoretical resolution limit of the optical system.

The optical rotatory function of a common twisted nematic liquid crystal element is as described hereinbefore with reference to FIGS. 4A and 4B.

In embodiment 2-C of the invention, a 90° twisted nematic liquid crystal element 603 is employed for the optical rotatory element. The liquid crystal element 603 does not comprise a region where the liquid crystal molecules undergo homogeneous alignment, and all regions thereof are set for 90° twisted nematic alignment when no voltage is applied thereto.

The liquid crystal element 603 is constructed such that a voltage can be applied to a region thereof so that only a region can be turned into the homeotropic state by applying a voltage thereto. That is, when a voltage is applied to a region of the liquid crystal element 603 according to embodiment 2-C, the region with the voltage applied is turned into a homeotropic region 603a, and regions other than that are turned into 90° twisted nematic regions 603b.

In order to obtain superresolved images with the superresolving optical apparatus according to this embodiment of the invention, a sufficient voltage is applied via transparent electrodes to the liquid crystal molecules in a region thereof set to become the homeotropic region 603a.

In the optical system shown in FIG. 9, the direction of an alignment axis of the liquid crystal element 603 on the incoming side of linearly polarized light 60 is set to substantially coincide with the direction of the polarization axis 60y of the linearly polarized light, both being oriented in the y-axis direction.

The linearly polarized light 60 emitted from a linearly polarized laser light source 101, and turned into plane waves by a collimating lens 102, falls on the liquid-crystal element 603.

In this embodiment, the homeotropic region 603a is formed in an oblong shape centering around the optical axis. A length of the homeotropic region 603a, along the y-axis direction, is set to cover a beam region of the linearly polarized light 60 while a width thereof, along the x-axis direction, is set to cover a part of the beam region of the linearly polarized light 60.

The linearly polarized light 60 which has fallen on the homeotropic region 603a is transmitted therethrough without being optically rotated. Then, linearly polarized light 60a transmitted through the region 603a falls on a substantially oblong region 104a centering around the optical axis O of a focusing optics 104.

In this instance, the oblong region 104a corresponds to the portion of an effective light beam 61 falling on the focusing optics 104. Further, in FIG. 9, since an aperture or the like for limiting a light beam falling on the focusing optics 104 is not employed, the effective light beam 61 coincides with the beam of the linearly polarized light 60 transmitted through the liquid crystal element 603. Consequently, there will not be much loss in light amount, and the effective light beam 61 passing through the focusing optics 104 is condensed at a point P, forming a beam spot.

Meanwhile, linearly polarized light 60b transmitted through the 90° twisted nematic regions 603b is optically rotated by 90°, and falls on regions 104b of the condensing optics 104. other than the oblong region 104a.

Polarization axes of the linearly polarized light falling on the oblong region 104a and the same falling on the regions 104b, other than the oblong region 104a, cross each other at right angles. Therefore, a superresolved image is formed for a component of the linearly polarized light. oriented in the x-axis direction, at the beam spot produced by the focusing optics 104.

Figure 10:
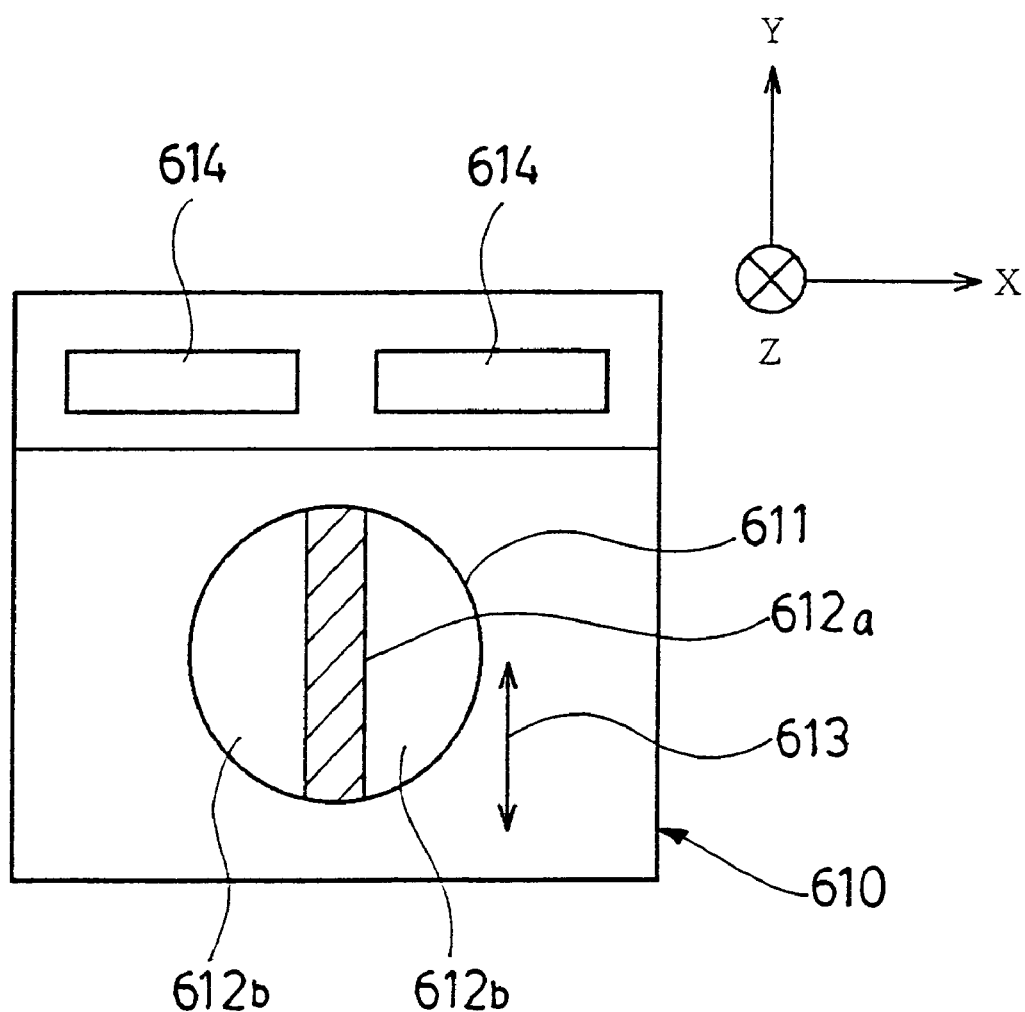
FIG. 10 is a view showing the construction of a twisted-nematic liquid crystal element manufactured by the inventor on an experimental basis in carrying out embodiment 2-C.

FIG. 10 is a view showing the construction of a twisted-nematic liquid crystal element manufactured by the inventor on an experimental basis in carrying out the embodiment 2-C.

The liquid crystal element 610 shown in the figure has an outer shape approximately 15 mm square, and is provided with a circular region 611 for filling in liquid crystals, 10 mm in diameter, at the center thereof. A homeotropic region 612a, 1 mm in width and substantially oblong in shape, is formed in the center area of the circular region 611 for filling in the liquid crystals when a voltage is applied thereon, and 90° twisted-nematic regions 612b are formed in the rest of the circular region 611.

The direction 613 of an alignment axis of liquid crystal molecules on the incoming side of linearly polarized light coincides with the direction of the long sides of the homeotropic region 612a, oblong in shape, which is assumed to be in the direction of the y-axis. The optical axis is extended in the direction of the z-axis, perpendicular to the plane of the drawing.

Electrodes 614, 614 are provided in the upper part of the liquid-crystal element. and by applying a sufficient external voltage thereto, the homeotropic region 612a can be formed. Further, with reference to the previously described formula (2), the liquid crystal element substantially satisfies the condition that the result of the formula should be nearly the square root of 15 with respect to light at a wavelength of 633 nm.

In the optical system actually employed, the beam of the linearly polarized light was in the shape of a circle about 5 mm in diameter, and as the focusing optics 104, a lens with the focal length at 500 mm was disposed about 5 cm away from the liquid-crystal element 603.

Figure 11A:
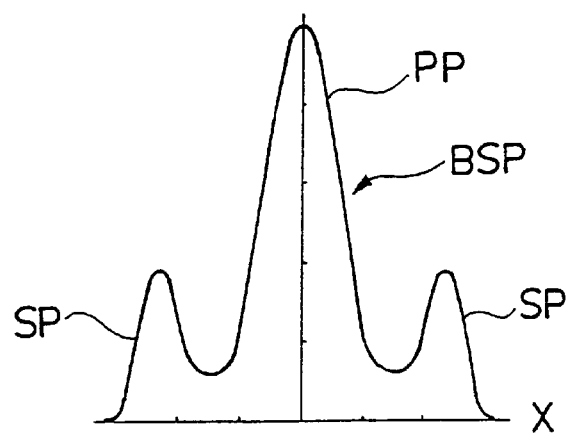
FIG. 11A is a chart showing a beam spot profile in the direction of the x-axis formed at a point P in embodiment 2-C.
Figure 11B:
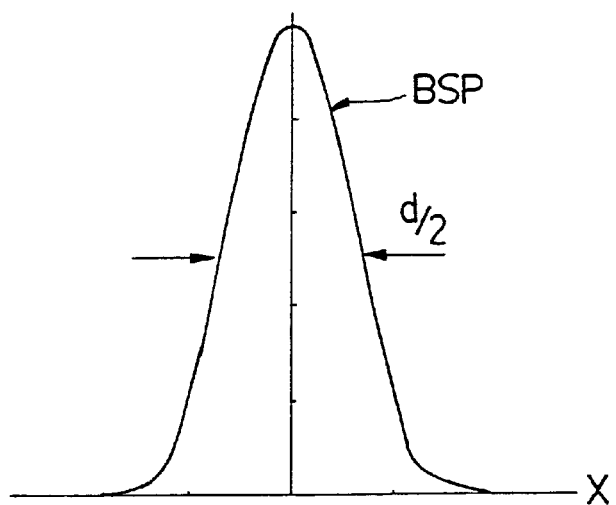
FIG. 11B is a chart showing a beam spot profile in the direction of the x-axis formed at a point P in the optical system according to embodiment 2-C when a voltage applied to a homeotropic region in a liquid crystal element is removed.

FIG. 11A shows the profile in the x-axis direction of a beam spot formed at the point P in carrying out embodiment 2-C. FIG. 11B shows the beam spot profile in the x-axis direction at the point P in a state where a voltage is not applied to the homeotropic region 603a of the liquid crystal element 603 according to embodiment 2-C of the invention.

A half width d/2 of peak profile PP occurring in the center of the beam spot as shown in the beam spot profile BSP in FIG. 11A is seen narrower by about 15% than that shown in the beam spot profile BSP in FIG. 11B, indicating formation of a superresolved image. The beam spot profile BSP in FIG. 11A shows that sidelobes SP occurred on the opposite sides of the peak profile PP formed at the center.

Figure 11C:
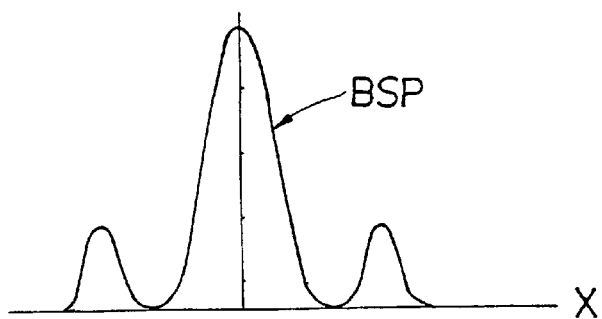
FIG. 11C is a chart showing a beam spot profile in the direction of the x-axis formed at a point P in an optical system according to embodiment 2-C wherein the liquid crystal element is removed, and instead, a shading band is disposed in the central region of a condensing optics.

FIG. 11C shows a beam spot profile BSP in the x-axis direction at the point P when the optical system according to embodiment 2-C is constructed without the liquid-crystal element 603 installed, and instead, is provided with an oblong shielding plate 1 mm wide in the x-axis direction and 10 mm long in the y-axis direction, which is disposed in the central region of the focusing optics 104.

It was found by checking the optical utilization ratio that in embodiment 2-C, about a 15% loss of light power due to the presence of the liquid crystal element 603 was observed (refer to FIGS. 11A and 11B). However, it is possible to reduce the light power loss to not more than 10% by applying non-reflective coating to the glass substrates of the liquid crystal element.

On the other hand, with the construction of a conventional optical apparatus employing the shielding band as described above, the light power loss amounting to as much as about 40% was observed (refer to FIGS. 11A and 11C).

Further, the superresolution effect was found to be enhanced by applying an adequate bias voltage to the 90° twisted nematic regions 603b as well. It appears that this is attributable to more efficient occurrence of a phenomenon of optical rotation due to reduced birefringence by applying a bias voltage close to a voltage at which the liquid crystals are activated.

With reference to the construction of embodiment 2-C, the homeotropic region 603a of the liquid-crystal element 603 functions as a region for preventing the polarization axis of the linearly polarized light from being optically rotated. Such a function may be achieved by not forming a liquid crystal layer in the region. In such a case, however, there is a risk of phase modulation occurring to the linearly polarized light because of a difference in an optical path length occurring between the region with the liquid crystal layer and the same without the liquid crystal layer. Accordingly, there will be a need in this case for compensating for the phase modulation by use of the focusing optics 104, or other optics.

Further, the direction of liquid crystal molecular alignment in the homeotropic region 603a may be set to be homeotropic or homogeneous from the outset. However, this requires that 90° twisted nematic alignment and homeotropic alignment, or homogeneous alignment be applied to liquid crystal molecules during the manufacturing process of the liquid crystal element, and consequently, complex alignment techniques, for example, mask rubbing, wherein while rubbing for alignment is applied to one region, another alignment region needs to be masked, will be required.

Embodiment 3-A

Figure 12:
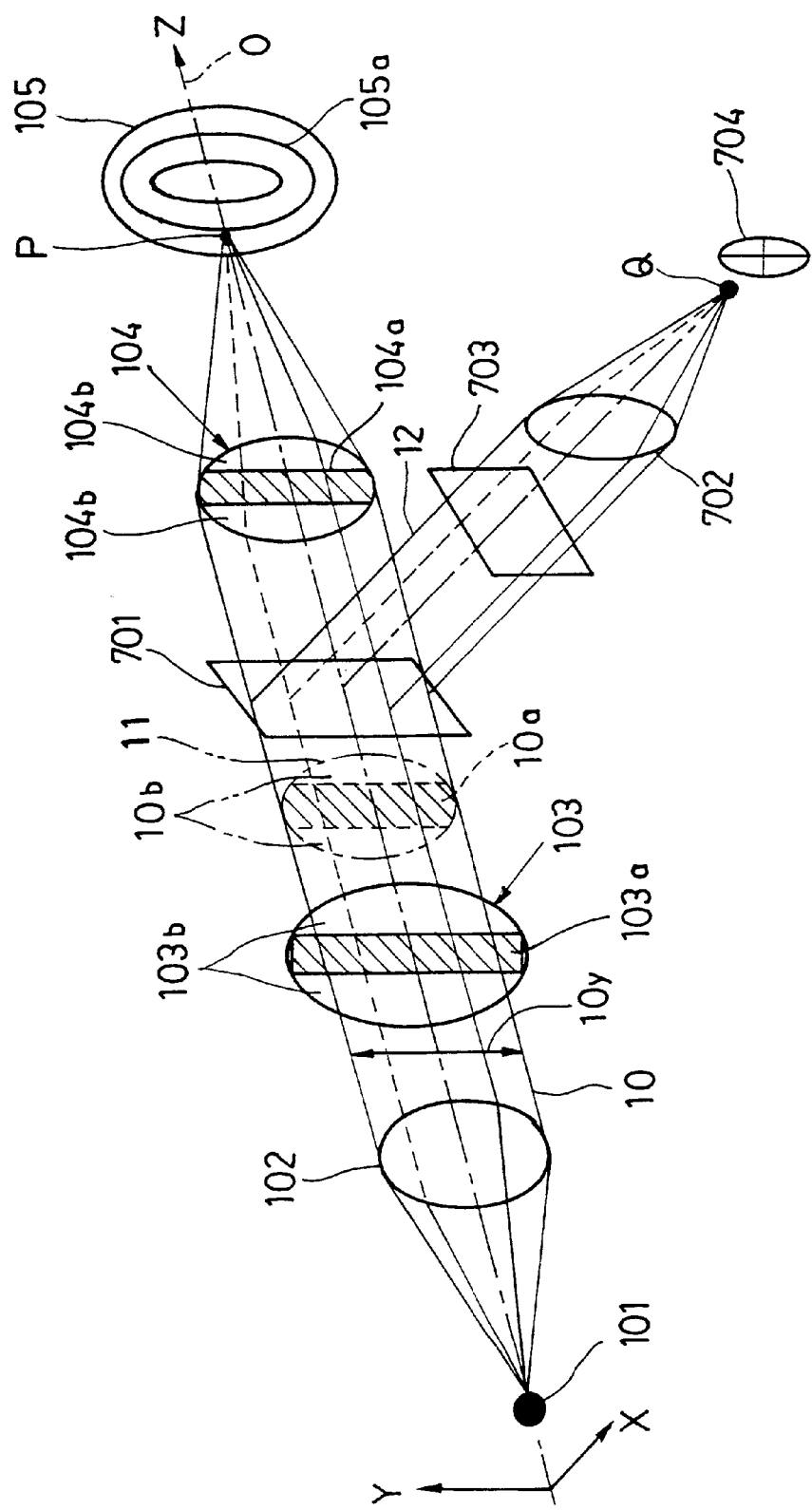
FIG. 12 is a schematic illustration showing embodiment 3-A of an optical apparatus according to the invention, as applied to an optical disc system.

FIG. 12 is a schematic illustration showing embodiment 3-A of an optical apparatus according to the invention, as applied to an optical disc system. In FIG. 12, parts corresponding to those previously described with reference to FIG. 1 are denoted by the same reference numerals.

In this embodiment, an optical system for the optical disc system comprises a linearly polarized laser light source 101, a collimating lens 102, an optical rotatory element 103, a focusing optics 104, an optical splitting element 701, a focusing optics 702, and a linearly polarized light detection element 703.

Linearly polarized light 10 emitted from the linearly polarized laser light source 101 is turned into plane waves by the collimating lens 102. In this instance, the linearly polarized light 10 is assumed to have a polarization axis 10y oriented in the direction of the y-axis.

When the linearly polarized light 10 is transmitted through the optical rotatory element 103, the direction of the polarization axis 10y is rotated due to the optical rotating power of the optical rotatory element 103. More specifically, the optical rotatory element 103 is composed of a region 103a wherein the linearly polarized light 10 falling thereon is rotated by $\theta°$ in the direction of the x axis crossing the y axis at right angles, and regions 103b wherein the linearly polarized light 10 falling thereon is rotated by $(\theta-90)°$ in the direction described.

As indicated by hatching in FIG. 12, the region 103a wherein the linearly polarized light 10 falling thereon is rotated by $\theta°$ is formed in an oblong shape centering around the optical axis. Consequently, linearly polarized light 10a transmitted through the region 103a for rotating the polarization of light by $\theta°$ falls on a substantially oblong region 104a centering around the optical axis O of the focusing optics 104. The oblong region 104a corresponds to a portion of an effective light beam 11 falling on the focusing optics 104. Further, in FIG. 12, since a stop or the like for limiting a light beam falling on the focusing optics 104 is not used, the effective light beam 11 coincides with the beam of the linearly polarized light 10 transmitted through the optical rotatory element 103.

Meanwhile, linearly polarized light 10b transmitted through the regions 103b for rotating the polarization of light by $(\theta-90)°$ falls on regions 104b of the focusing optics 104, other than the oblong region 104a.

In this connection, the polarization axis of the linearly polarized light 10a falling on the oblong region 104a intersects that of the linearly polarized light 10b falling on the regions 104b, other than the oblong region 104a, at right angles. Since these components of the linearly polarized light, crossing each other at right angles, do not interfere with each other, the same behave as if they were shielded by each other. As a portion of the effective light beam 11 is blocked in the direction of the x-axis in the oblong region 104a, a superresolved image will be formed for an x-axis component of the effective light beam 11 at a beam spot P, formed by the focusing optics 104.

Accordingly, when recording information on an optical disc 105, a spacing between spiral recording grooves 105$a$ of the optical disc 105, namely, a track pitch, can be reduced by disposing the optical disc 105 at the position of the beam spot P as well as by orienting the tangent line of the each spiral recording groove 105$a$ so as to cross the x-axis at right angles, thereby enabling enhancement in recording density.

For the optical disc system shown in FIG. 12, the region 103$a$ of the optical rotatory element 103, for rotating the polarization of light by θ°, is formed in an oblong shape, however, the same may be formed in a circular shape centering around the optical axis. In this case, a superresolved image will be formed for components of the effective light beam, in the directions of both the x-axis and y-axis. Furthermore, the region 103$a$ for rotating the polarization of light by θ° need not be formed in an exact oblong or circular shape. Similar superresolved images may be formed with the region 103$a$ having some notches or distortions. In addition, even if the center of the region 103$a$ is somewhat off the optical axis of the optical system, a sufficient superresolved image may be formed as well.

Next, a light beam reflected from the focused spot P on the optical disc 105 returns along substantially the same optical path as the incoming optical path, and is split by the optical splitting element 701 after being transmitted through the focusing optics 104. The optical apparatus according to this embodiment is constructed such that a split light beam 12 is condensed by the focusing optics 702, and a focused spot Q is detected by an optical detection element 704. The linearly polarized light detection element 703 is disposed in the optical path for the split light beam 12.

As the linearly polarized light detection element 703 is disposed such that the orientation thereof is set between the x-axis direction and the y-axis direction, the same has a function of eliminating the orthogonal relationship between the x-axis direction and y-axis direction, thereby removing sidelobes from the focused spot Q. Accordingly, sidelobes can be removed from the focused spot Q without the use of the slit method, or the like.

Figure 13:
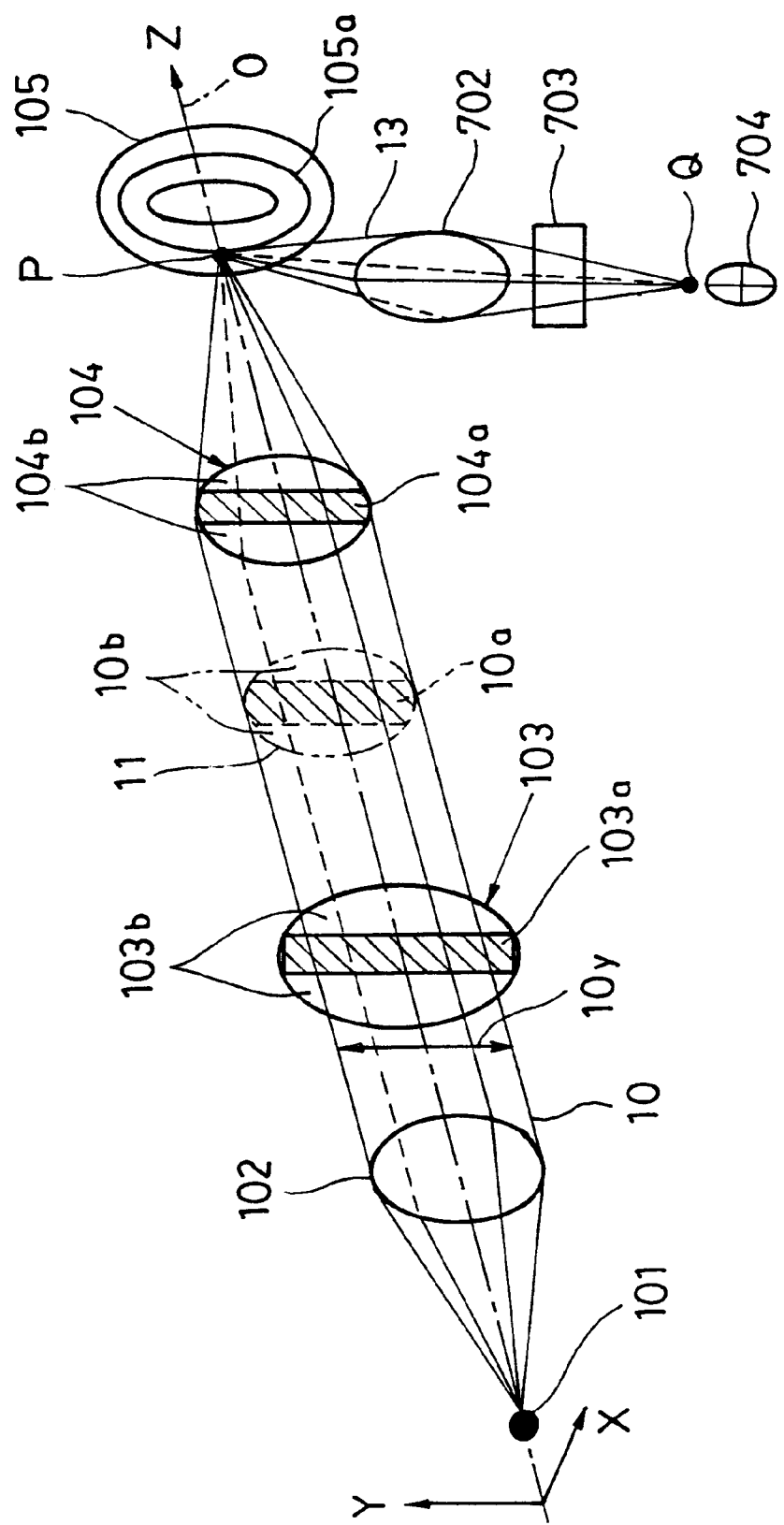
FIG. 13 is a schematic illustration showing a variation of embodiment 3-A of an optical apparatus according to the invention.

FIG. 13 is a schematic illustration showing a variation of embodiment 3-A of the invention, described above. In FIG. 13, parts corresponding to those described with reference to FIG. 12 are denoted by the same reference numerals.

In the variation of the embodiment shown in FIG. 13, an optical splitting element is not employed. Instead, an optical system is constructed such that an optical disc 105 is disposed tilted at an angle.

More specifically by disposing the optical disc 105 in a tilted fashion, the focused spot P formed on the optical disc 105 can be reflected in an optional direction at varying tilt angles against the incident direction. Further, by disposing another focusing optics 702, and an optical detection element 704 on the reflection side of the focused spot P, a focused spot Q can be detected with the optical detection element 704.

Further, by disposing a linearly polarized light detection element 703 in the optical path of a light beam 13 reflected from the optical disc 105 as with the case of Embodiment 3-A, sidelobes can be removed from the focused spot Q without the use of the slit method, or the like.

Embodiment 3-B

Figure 14:
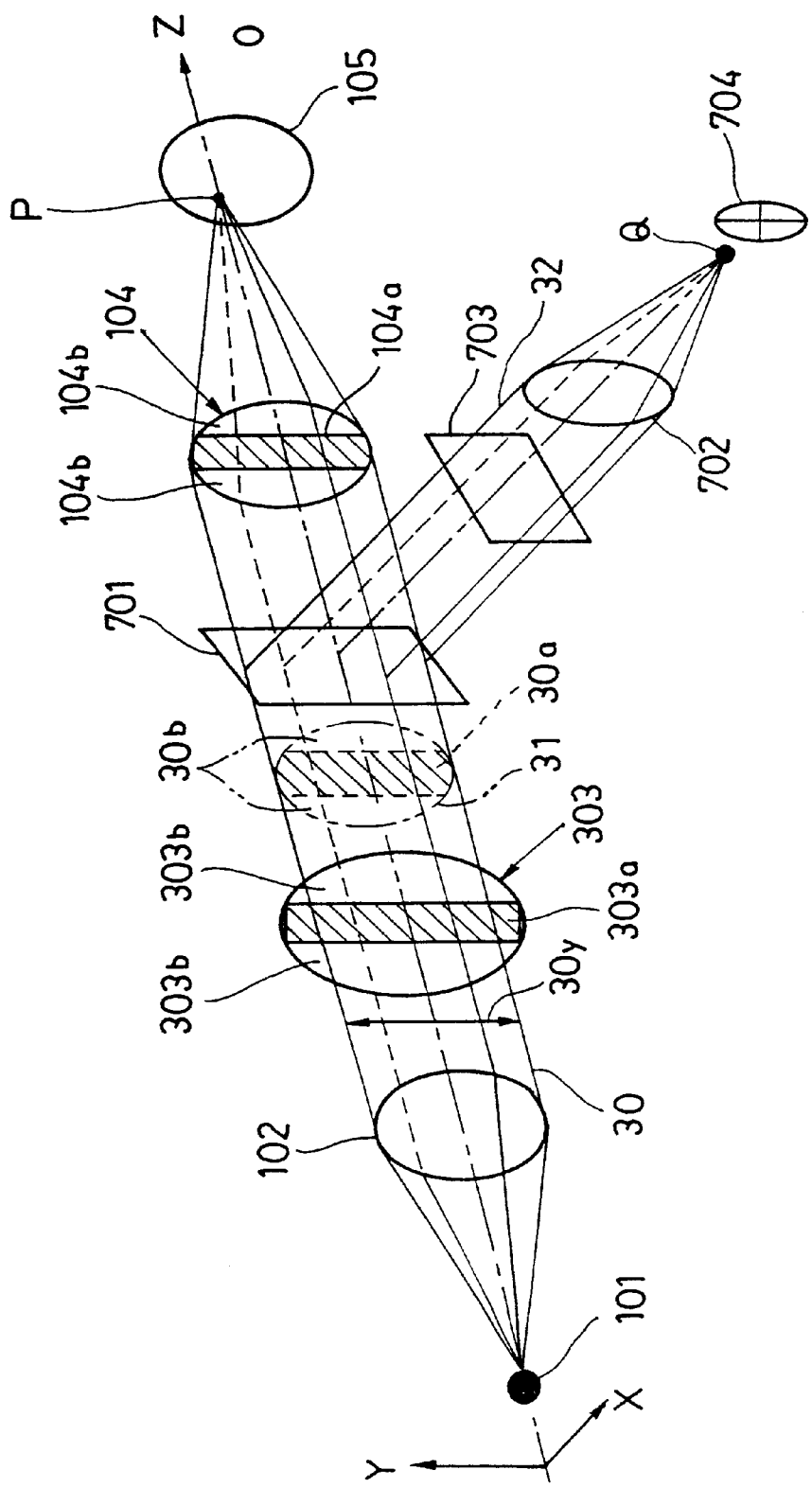
FIG. 14 is a schematic illustration showing embodiment 3-B of an optical apparatus according to the invention, using twisted-nematic crystals for an optical rotatory element.

FIG. 14 is a schematic illustration showing embodiment 3-B of an optical apparatus according to the invention, wherein twisted-nematic liquid crystals are employed for an optical rotatory element. In FIG. 14, parts corresponding to those previously described with reference to FIG. 3 are denoted by the same reference numerals.

With an optical system shown in FIG. 14, it is possible to construct a superresolving optical apparatus capable of forming a micro-beam spot exceeding the theoretical resolution limit of the optical system.

The optical rotatory function of a common twisted-nematic liquid crystal element is as described hereinbefore with reference to FIGS. 4A and 4B.

In this embodiment of the invention, a twisted-nematic liquid crystal element 303 is employed for the optical rotatory element.

In the optical system shown in FIG. 14, the direction of an alignment axis of the liquid crystal element 303 on the incoming side of the linearly polarized light 30 is set to substantially coincide with the polarization axis 30$y$ of the linearly polarized light, both being oriented in the y-axis direction.

The linearly polarized light 30 emitted from a linearly polarized laser light source 101, and turned into plane waves by a collimating lens 102 falls on the liquid crystal element 303. The liquid crystal element 303 is composed of a homogeneous region 303$a$ and a 90° twisted-nematic region 303$b$.

In this embodiment, the homogeneous region 303$a$ is formed in an oblong shape centering around the optical axis. The length of the homogeneous region 303$a$, along the y-axis direction, is set to cover a beam region of the linearly polarized light 30, while the width thereof, along the x-axis direction, is set to cover a part of the beam region of the linearly polarized light 30.

The linearly polarized light 30 which has fallen on the homogeneous region 303$a$ of the liquid-crystal element 303 is transmitted therethrough without being optically rotated. Then, linearly polarized light 30$a$ transmitted through the homogeneous region 303$a$ falls on a substantially oblong region 104$a$ centering around the optical axis O of focusing optics 104.

In this instance, the oblong region 104$a$ corresponds to the portion of an effective light beam 31 falling on the focusing optics 104. Further, with the optical system shown in FIG. 14, since an aperture or the like for limiting a light beam falling on the focusing optics 104 is not employed, an effective light beam 31 coincides with the beam of the linearly polarized light 30 transmitted through the liquid crystal element 303. Consequently, there will not be much loss in light amount, and the effective light beam 31 passing through the focusing optics 104 is condensed at a point P, forming a beam spot.

Meanwhile, linearly polarized light 30$b$ transmitted through the 90° twisted-nematic regions 303$b$ is optically rotated by 90°, and falls on regions 104$b$ of the focusing optics 104, other than the oblong region 104$a$.

Polarization axes of the linearly polarized light falling on the oblong region 104$a$ and the same falling on the region 104$b$, other than the oblong region 104$a$, cross each other at right angles. Consequently, a superresolved image is formed for a component of the effective light beam, oriented in the x-axis direction, at the beam spot P produced by the focusing optics 104.

Figure 15:
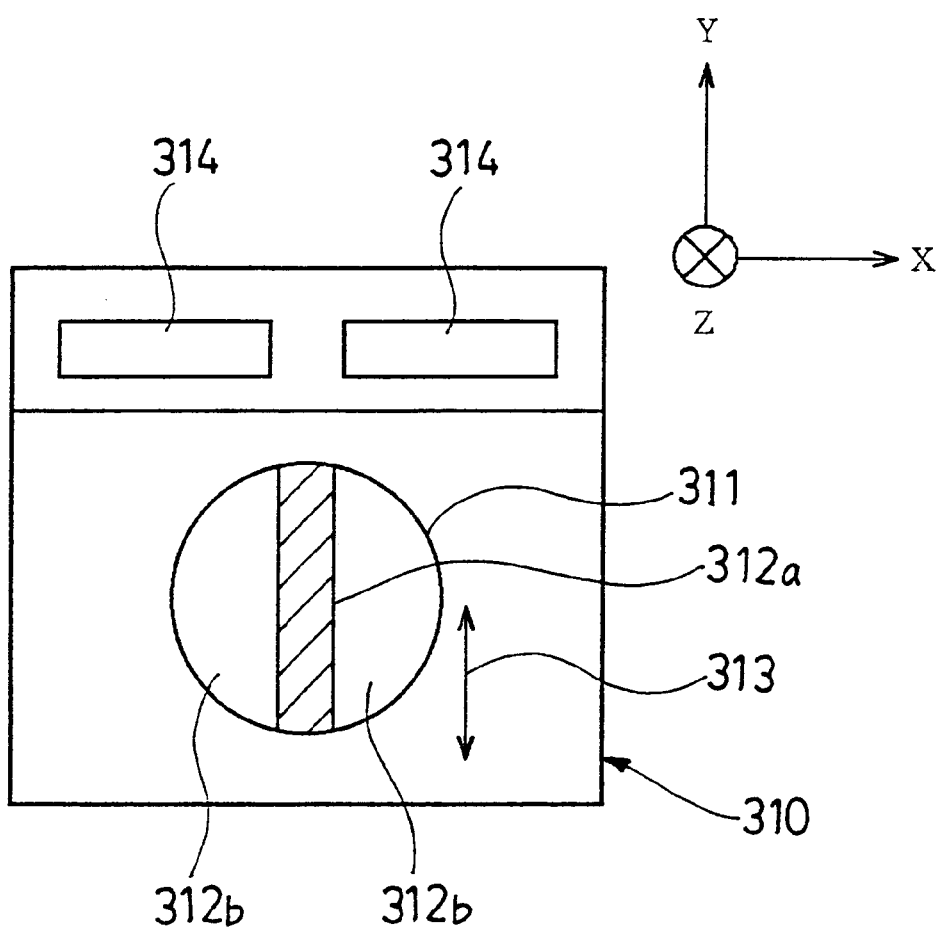
FIG. 15 is a view showing the construction of a twisted-nematic liquid crystal element manufactured by the inventor on an experimental basis in carrying out embodiment 3-B.

FIG. 15 is a view showing the construction of a twisted-nematic liquid-crystal element manufactured by the inventor on an experimental basis in carrying out the embodiment 3-B.

The liquid crystal element 310 shown in the figure has an outer shape about 15 mm square, and is provided with a region 311 for filling in liquid crystals, 10 mm in diameter, at the center thereof. A homogeneous region 312$a$, 1 mm in width and substantially oblong in shape, is formed in the center area of the region 311 for sealing in the liquid crystals, and 90° twisted-nematic regions 312b are formed in the rest of the region 311.

The direction 313 of an alignment axis of liquid crystal molecules on the incident light side coincides with that of the long sides of the homogeneous region 312a, oblong in shape, which is assumed to be the y-axis. The optical axis is extended in the direction of the z-axis, perpendicular to the plane of the drawing. Electrodes 314, 314 are provided in the upper part of the liquid crystal element, and the entire region for filling in the liquid crystals can be turned homeotropic by applying a sufficient external voltage to the electrodes. Further, with reference to the previously described formula (2), the liquid crystal element substantially satisfies the condition that the result of the formula should be the square root of 15 against light at a wavelength of 633 nm.

In the optical system actually employed, the beam of the linearly polarized light 30 was in the shape of a circle about 5 mm in diameter, and as the focusing optics 104, a lens with the focal length at 500 mm was disposed about 5 cm away from the liquid crystal element 303.

Figure 16A:
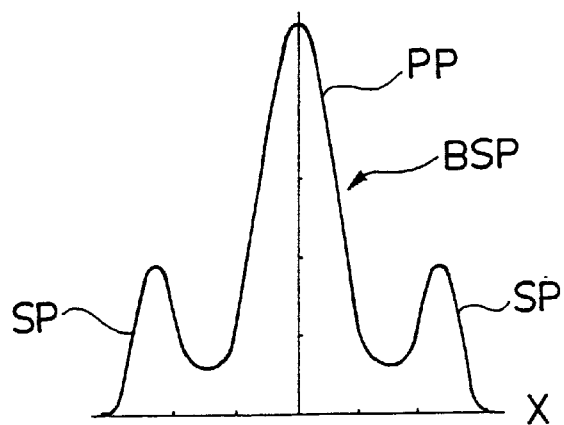
FIG. 16A is a chart showing a beam spot profile in the direction of the x-axis formed at a point P in embodiment 3-B.
Figure 16B:
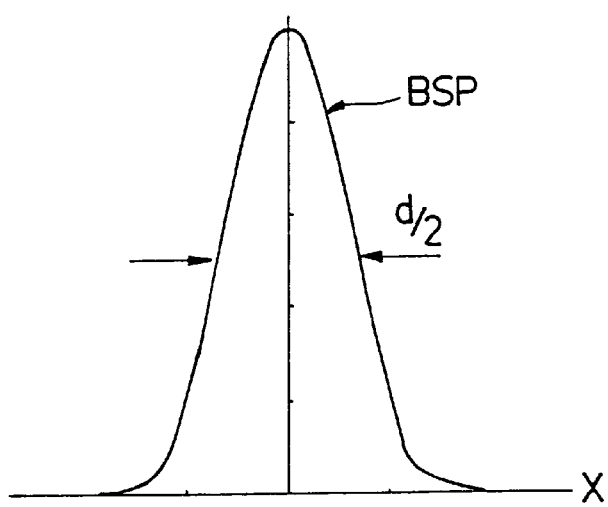
FIG. 16B is a chart showing a beam spot profile in the direction of the x-axis formed at a point P in the optical system according to embodiment 3-B when a voltage applied to a homeotropic region in a liquid crystal element is removed.

FIG. 16A shows the profile in the x-axis direction of the beam spot formed at the point P in carrying out embodiment 3-B. FIG. 16B shows the beam spot profile in the x-axis direction at the point P when the optical system according to the embodiment 3-B is constructed without the liquid crystal element 303 installed.

A half width d/2 of the peak profile PP occurring in the center of the beam spot shown in the beam spot profile BSP in FIG. 16A is seen narrower by about 15% than that shown in the beam spot profile BSP in FIG. 16B, indicating formation of a superresolved image. The beam spot profile BSP in FIG. 16A shows that sidelobes SP occurred on the opposite sides of the peak profile PP formed at the center.

Figure 16C:
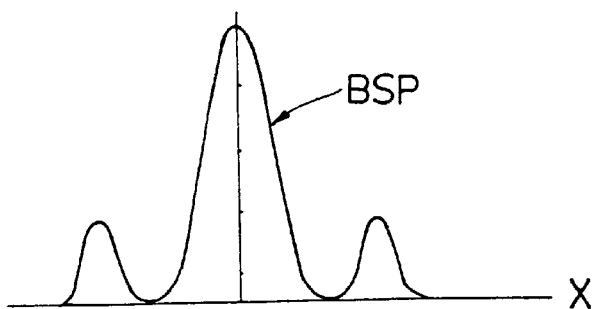
FIG. 16C is a chart showing a beam spot profile in the direction of the x-axis formed at a point P in an optical system according to embodiment 3-B wherein the liquid crystal element is removed, and instead, a shading plate is disposed in the central region of a condensing optics.

FIG. 16C shows the beam spot profile BSP in the x-axis direction at the point P when the optical system according to embodiment 3-B is constructed without the liquid-crystal element 303, but is provided with an oblong shielding band, 1 mm wide in the x-axis direction and 10 mm long in the y-axis direction, which is disposed in the central region of the focusing optics 104 (that is, the construction of a conventional optical apparatus).

It was found by checking the optical utilization ratio that in embodiment 3-B, about a 15% loss of light power due to the presence of the liquid crystal element 303 was observed (refer to FIGS. 16A and 16B). However, it is possible to reduce the light power loss to not more than 10% by applying non-reflective coating to the glass substrates of the liquid-crystal element.

On the other hand, with the construction of the conventional optical apparatus employing the shielding band as described above, the light power loss amounting to as much as about 40% was observed (refer to FIGS. 16A and 16C).

Further, with the construction of embodiment 3-B, when the entire region of the liquid-crystal element 303 was turned homeotropic in the z-axis direction by applying a voltage thereto, the beam spot profile at the point P substantially coincided with that shown in FIG. 16B. This is due to a lack of optical rotation of the polarization axis (refer to FIG. 4B). That is, with the construction of embodiment 3-B, a superresolved image as well as a normally resolved image can be realized at will and with ease by controlling the voltage applied to the liquid crystal element 303.

Further, even in the case of realizing a superresolved image, the superresolution effect was enhanced by applying an adequate bias voltage to the liquid crystal element 303 beforehand. It appears that this is attributable to a more efficient occurrence of a phenomenon of optical rotation due to reduced birefrigence by applying a bias voltage close to a voltage at which the liquid crystals are activated.

With reference to the construction of embodiment 3-B, the homogeneous region 303a of the liquid-crystal element 303 functions as a region for preventing the polarization axis of the linearly polarized light from being optically rotated. Such a function may be achieved by dispensing with a liquid crystal layer formed in the region. In such a case, however, there is a risk of phase modulation occurring to the linearly polarized light falling thereon because of a difference in an optical path length occurring between the region with the liquid crystal layer and the same without the liquid crystal layer. Accordingly, there will be a need in this case for compensating for the phase modulation by use of the condensing optics 104, or other optics.

Also, with the construction of embodiment 3-B, even when the homogeneous region 303a of the liquid crystal element 303 is turned into a θ° twisted-nematic region, and the 90° twisted-nematic region 303b into a (θ−90)° twisted-nematic region, a superresolved image can still be formed because polarization axes of the linearly polarized light passing through respective regions cross each other at right angles.

Now, the optical disc 105 of reflective type is disposed on the same plane where the beam spot P is formed so as to cross the optical axis O substantially at right angles. Accordingly, a light beam condensed at the beam spot P is reflected from the surface of the optical disc 105 of reflective type in the direction of the optical axis O. The light beam thus reflected is transmitted through the focusing optics 104 again, and is split by an optical splitting element 701. The optical splitting element 701 is disposed on the optical axis O, and halfway between the liquid crystal element 303 and the focusing optics 104.

The light beam 32 split by the optical splitting element 701 is condensed by another focusing optics 702, forming a focused spot Q. An optical detection element 704 is installed to detect the focused spot Q. Further, a linearly polarized light detection element 703 is disposed in the optical path of the split light beam 32.

The linearly polarized light detection element 703 has the function of removing sidelobes from the focused spot Q.

In embodiment 3-B, a prism beam splitter was employed for the optical splitting element 701, a lens with a focal length at 500 mm for the focusing optics 702, and a polarizing plate for the linearly polarized light detection element 703, respectively.

Figure 17A:
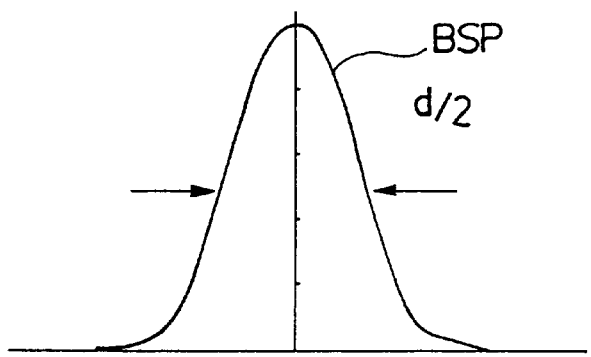
FIG. 17A is a chart showing a beam spot profile of a focused spot Q as detected by an optical detection element installed in the optical system according to embodiment 3-B.

FIG. 17A shows the beam spot profile BSP of the focused spot Q. detected by the optical detection element 704 in carrying out embodiment 3-B. The half width d/2 of the beam spot profile BSP was found to become larger, however, as sidelobes were removed. In this connection, an increase in the half width of the beam spot profile will have little effect on the detection of information recorded in the optical disc 105.

Figure 17B:
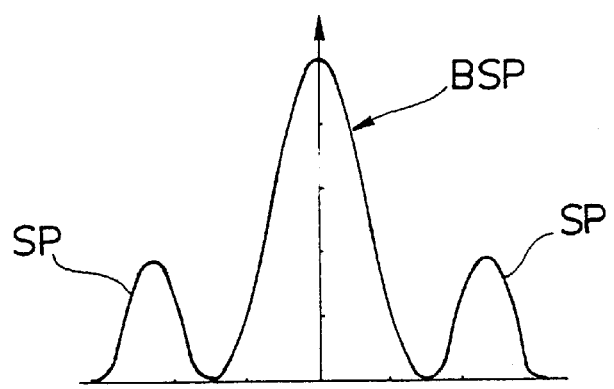
FIG. 17B is a chart showing a beam spot profile of the focused spot Q as detected by an optical detection element installed in the optical system according to embodiment 3-B wherein a linearly polarized light detection element is removed.

FIG. 17B shows the beam spot profile BSP of the focused spot Q as detected by the optical detection element 704 when the optical system according to embodiment 3-B is constructed without the linearly polarized light detection element 703. As shown in the figure, sidelobes SP are found to have occurred at the beam spot profile BSP. The sidelobes SP become a source of signal noise when reproducing information recorded in the optical disc 105.

Figure 18:
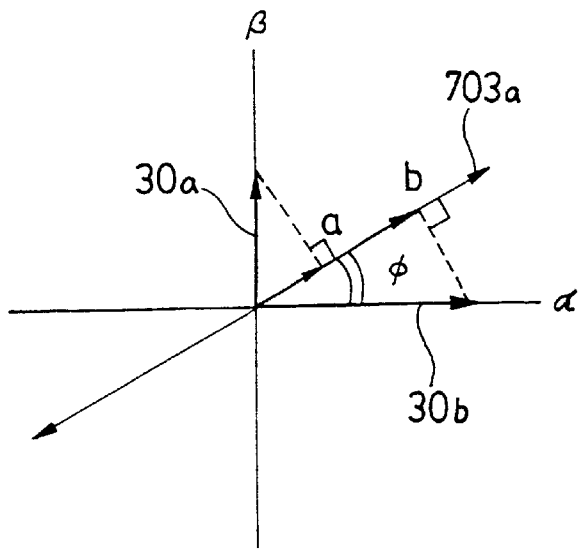
FIG. 18 is a chart showing the orientation of the linearly polarized light detection element used in carrying out embodiment 3-B of the invention.

FIG. 18 shows the orientation 703a of the linearly polarized light detection element 703 employed in carrying out the embodiment 3-B, that is, the orientation of the transmission axis of the linearly polarized light.

The beam of the linearly polarized light transmitted through the linearly polarized light detection element 703 comprises the linearly polarized light 30b optically rotated by 90°, and the linearly polarized light 30a optically unrotated.

Assuming that in FIG. 18, the α axis is the direction of the polarization axis of the linearly polarized light 30b optically rotated by 90°, and the β axis that of the linearly polarized light 30a optically unrotated, the sidelobes SP could be removed almost completely from the focused spot Q when the orientation 703a of the linearly polarized light detection element 703 was arranged to form an angle of about 40° with respect to the α axis. It was subsequently confirmed that as the orientation φ of the linearly polarized light detection element 703 was shifted, the sidelobes SP came to emerge gradually.

By setting the orientation 703a of the linearly polarized light detection element 703 between the α axis and the β axis, orientation components, a and b, respectively. of the linearly polarized light detection element 703 can be taken out of the linearly polarized light comprising components with the polarization axes thereof crossing each other at right angles. It is deemed that as a result of the above. the orthogonal relationship between the respective components of the linearly polarized light disappears, removing the sidelobes SP. In this connection, as is evident from FIG. 18, an equivalent phenomenon will result when the orientation φ of the linearly polarized light detection element 703 is tilted by 90°.

Embodiment 4-A

Figure 19:
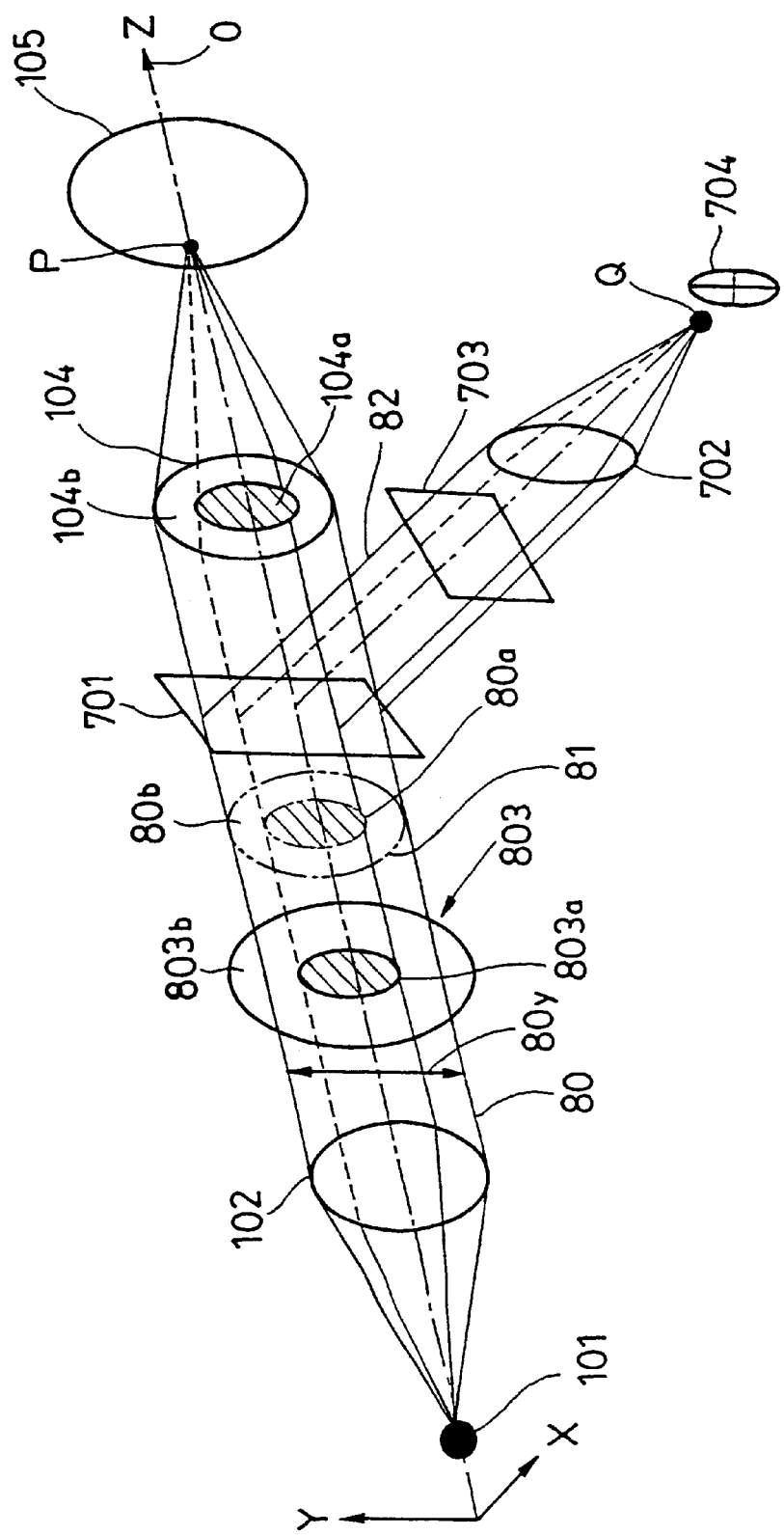
FIG. 19 is a schematic illustration showing embodiment 4-A of an optical apparatus according to the invention, as applied to an optical disc system.

FIG. 19 is a schematic illustration showing embodiment 4-A of an optical apparatus according to the invention, as applied to an optical disc system. In FIG. 19, parts corresponding to those previously described with reference to FIG. 12 are denoted by the same reference numerals.

In this embodiment, an optical system for the optical disc system comprises a linearly polarized laser light source 101, a collimating lens 102, an optical rotatory element 803, a focusing optics 104, an optical splitting element 701, a focusing optics 702, and a linearly polarized light detection element 703.

Linearly polarized light 80 emitted from the linearly polarized laser light source 101 is turned into plane waves by the collimating lens 102. In this instance, the linearly polarized light 80 is assumed to have a polarization axis 80y oriented in the direction of the y-axis.

When the linearly polarized light 80 is transmitted through the optical rotatory element 803, the direction of the polarization axis 80y is rotated due to the optical rotating power of the optical rotatory element 803. More specifically, the optical rotatory element 803 is composed of a region 803a wherein the linearly polarized light 80 falling thereon is rotated by θ° in the direction of the x axis crossing the y axis at right angles, and a region 803b wherein the linearly polarized light 80 falling thereon is rotated by (θ−90)° in the direction described.

As indicated by hatching in FIG. 19. the region 803a wherein the linearly polarized light 80 falling thereon is rotated by θ° is formed in an circular shape centering around the optical axis. Consequently, linearly polarized light 80a transmitted through the region 803a for rotating the polarization of light by θ° falls on a substantially circular region 104a centering around the optical axis O of the focusing optics 104. The circular region 104a corresponds to a portion of an effective light beam 81 falling on the focusing optics 104, and has a smaller numerical aperture than that constituted by the effective light beam 81.

In this embodiment, the numerical aperture constituted by the effective light beam 81 is set for application to DVDs, and the numerical aperture constituted by the linearly polarized light 80a is set for application to CDs. Further, in FIG. 19, since a stop or the like for limiting a light beam falling on the focusing optics 104 is not used, the effective light beam 81 coincides with the beam of the linearly polarized light 80 transmitted through the optically rotatory element 803.

Meanwhile, linearly polarized light 80b transmitted through the region 803b for rotating the polarization of light by (θ−90)° falls on a region 104b of the focusing optics 104, other than the oblong region 104a.

In this connection, the polarization axis of the linearly polarized light falling on the circular region 104a intersects that of the linearly polarized light falling on the region 104b, other than the circular region 104a, at right angles.

The light beam falling on the optical disc 105 returns along substantially the same optical path as an incoming optical path, is transmitted again through the focusing optics 104, and is split by the optical splitting element 701. In this instance, the split light beam 82 keeps the initial state of polarization unless the optical disc 105 has an intense birefringence and diffraction dependent on polarization. In the case of common optical discs, birefringence is as small as 20 nm or less, and diffraction dependent on polarization hardly occurs.

The split light beam 82 is condensed by the focusing optics 702, forming a focused spot Q. An optical detection element 704 is disposed on the focused spot Q.

Further, the linearly polarized light detection element 703 is set in the optical path of the split light beam 82.

If the preferred orientation (the direction in which the linearly polarized light can be transmitted) of the linearly polarized light detection element 703 is adjusted to be in the direction of θ°, this will cause the polarization axis of the linearly polarized light 80b which is optically rotated by (θ−90)° to run at right angles to the preferred orientation of the linearly polarized light detection element 703. Consequently, the linearly polarized light 80b, a component of the linearly polarized light, optically rotated by (θ−90)° will be shaded.

The linearly polarized light in the state as described is suited for reproduction of information recorded in CDs and CD-ROMs. That is, the linearly polarized light 80b optically rotated by (θ−90)° is a light beam passing through the circumferential region of the focusing optics 104, having a large numerical aperture, and by nature, a portion of a light beam for application to DVDs. Accordingly, in the case that the same is applied to CDs, and the like, which have a difference thickness of a disc substrate from DVDs, it will become a reflected light beam having large aberration. Such a reflected light beam as described will disfigure the focused spot Q, degrading the detection accuracy of the optical detection element 704. By shading the linearly polarized light 80b component, optically rotated by (θ−90)°, having adverse effects on reproduction of information recorded in CDs, and the like, it is possible to enhance the reproduction accuracy of CDs and CD-ROMs.

On the other hand, in the case that the linearly polarized light is used for reproduction of information recorded in DVDs, the region 803b of the optical rotatory element 803 for optically rotating the linearly polarized light by (θ−90)° may also be switched over to a region for optically rotating the same by θ° so that the linearly polarized light falling on the entire region of the optical rotatory element 803 can be optically rotated by θ°. Then, all components of the effective light beam 81 will be transmitted through the linearly polarized light detection element 703, to form the focused spot Q.

Embodiment 4-B

Figure 20:
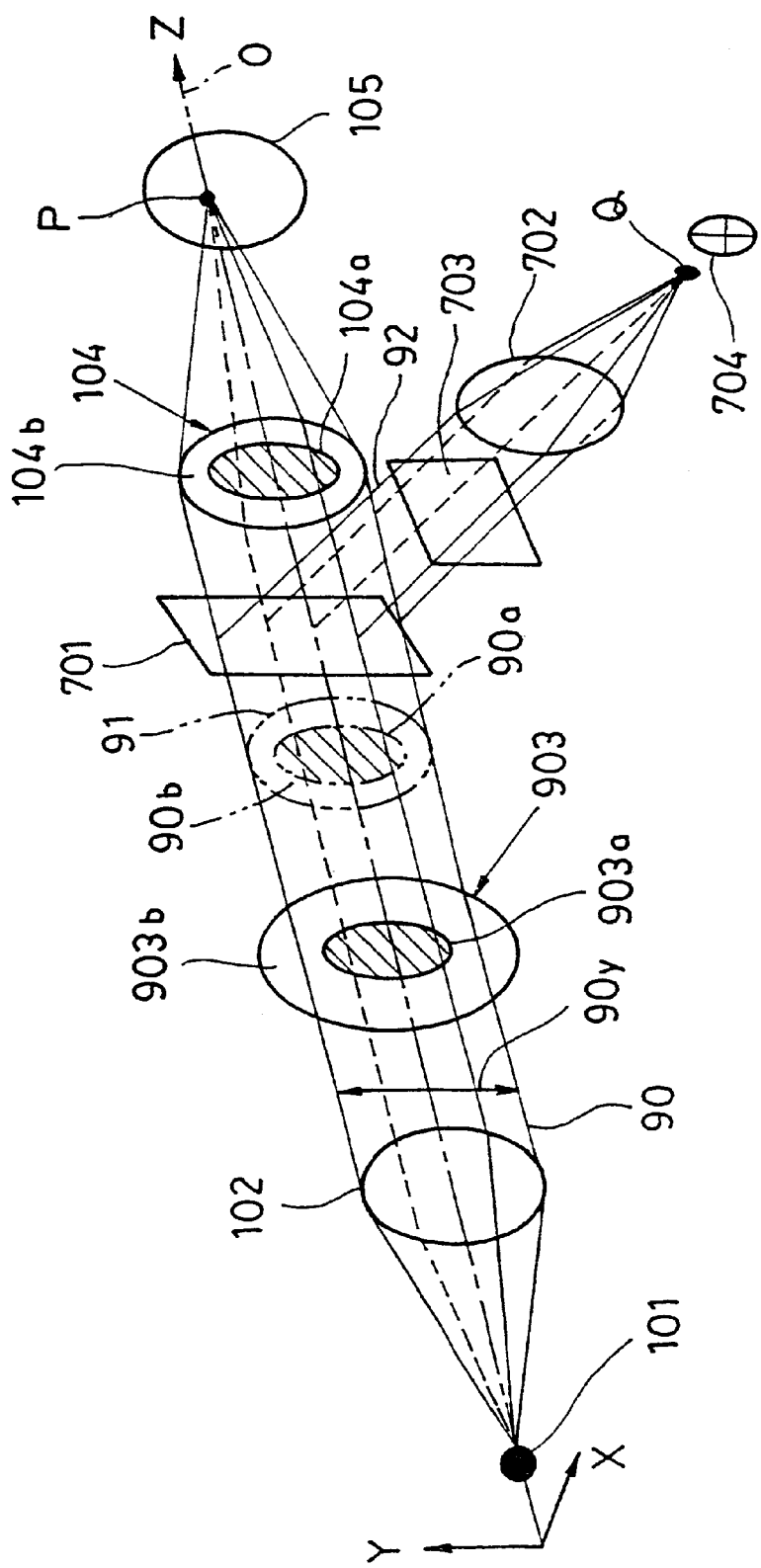
FIG. 20 is a schematic illustration showing embodiment 4-B of an optical apparatus according to the invention, using twisted-nematic liquid crystals for an optical rotatory element.

FIG. 20 is a schematic illustration showing embodiment 4-B of an optical apparatus according to the invention, wherein twisted nematic liquid crystals are employed for an optical rotatory element. In FIG. 20, parts corresponding to those previously described with reference to FIG. 19 are denoted by the same reference numerals.

The optical rotatory function of a common twisted-nematic liquid crystal element is as described hereinbefore with reference to FIGS. 4A and 4B. In the embodiment of the invention as shown in FIG. 20, a twisted-nematic liquid crystal element 903 having the optical property as described in the foregoing is employed for the optical rotatory element.

In the optical system shown in FIG. 20, the direction of an alignment axis of the liquid crystal element 903 on the incoming side of linearly polarized light 90 is set to substantially coincide with the polarization axis 90y of the linearly polarized light 90, both being oriented in the y-axis direction.

The linearly polarized light 90 emitted from a linearly polarized laser light source 101, and turned into plane waves by a collimating lens 102, falls on the liquid crystal element 903. The liquid crystal element 903 is composed of a homogeneous region 903a and a 90° twisted-nematic region 903b.

In this embodiment, the homogeneous region 903a is formed in a circular shape centering around the optical axis O.

The linearly polarized light 90 which has fallen on the homogeneous region 903a of the liquid crystal element 903 is transmitted therethrough without being optically rotated. Then, linearly polarized light 90a transmitted through the homogeneous region 903a falls on a substantially circular region 104a centering around the optical axis O of a condensing optics 104.

In this instance, the circular region 104a corresponds to the portion of an effective light beam 91 falling on the focusing optics 104, and has a smaller numerical aperture than that constituted by the effective light beam 91.

In this embodiment, the numerical aperture constituted by the effective light beam 91 is set for application to DVDs, and the numerical aperture constituted by the circular region 104a is set for application to CDs.

Further, in FIG. 20, since an aperture or the like for limiting a light beam falling on the focusing optics 104 is not used, the effective light beam 91 coincides with the beam of the linearly polarized light transmitted through the liquid crystal element 903. Consequently, there will not be much loss in light amount, and the effective light beam 91 passing through the focusing optics 104 is condensed at a point P, forming a beam spot.

Meanwhile, linearly polarized light 90b transmitted through the 90° twisted-nematic region 903b is optically rotated by 90°, and falls on a region 104b of the focusing optics 104, other than the circular region 104a.

Figure 21:
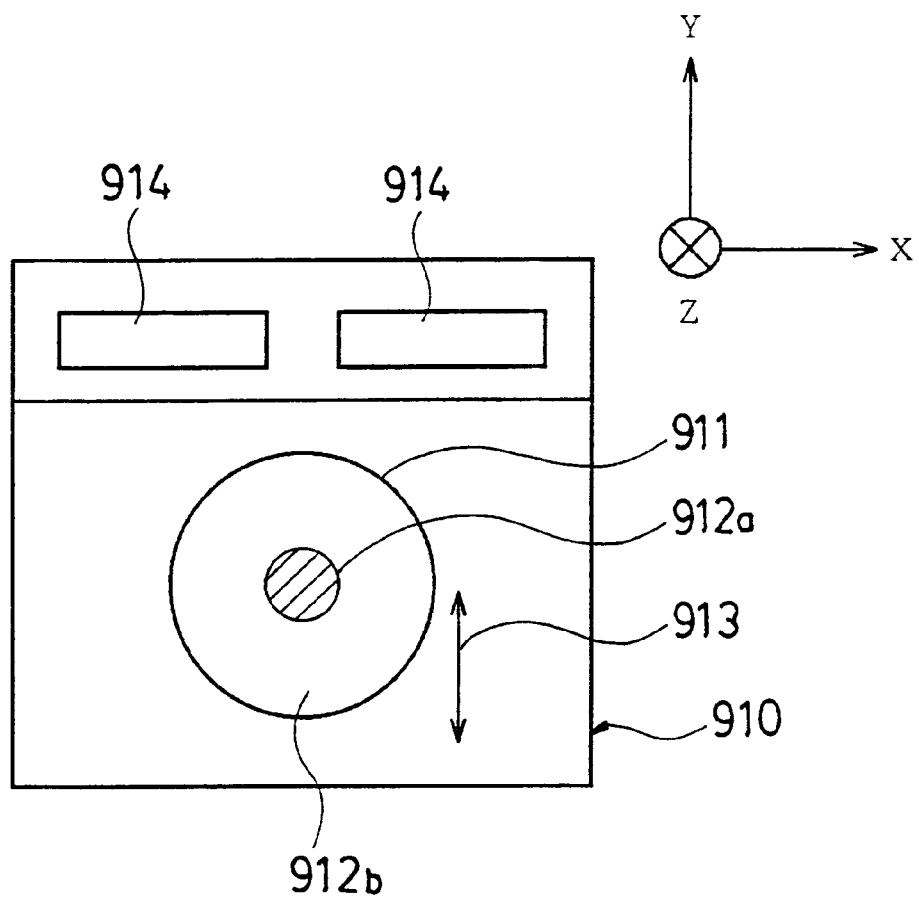
FIG. 21 is a view showing the construction of a twisted-nematic liquid crystal element used in carrying out embodiment 4-B of the invention.

FIG. 21 is a view showing the construction of a twisted-nematic liquid crystal element used in carrying out this embodiment.

A liquid crystal element 910 shown in the figure has an outer shape about 15 mm square, and is provided with a region 911 for filling liquid crystals, 10 mm in diameter, at the center thereof. A homogeneous region 912a, substantially circular in shape, and 3 mm in diameter, is formed in the center area of the region 911 for filling the liquid crystals, and a 90° twisted-nematic region 912b is formed in the rest of the region 911.

The direction 913 of an alignment axis of liquid crystal molecules on the incident light side is set to be in the direction of the y-axis. The optical axis is extended in the direction of the z-axis, perpendicular to the plane of the drawing. Electrodes 914, 914 are provided in the upper part of the liquid crystal element, and the entire region 911 for filling the liquid crystals can be turned homeotropic by applying a sufficient external voltage to the electrodes. Further, with reference to the previously described formula (2), the liquid crystal element substantially satisfies the condition that the result of the formula should be the square root of 15 with respect to light at a wavelength of 633 nm.

With reference to the construction of embodiment 4-B, the homogeneous region 903a of the liquid crystal element 903 functions as a region for preventing the polarization axis of the linearly polarized light from being optically rotated. Such a function may be achieved by dispensing with a liquid crystal layer formed in the region. In such a case, however, there is a risk of phase modulation occurring to the linearly polarized light falling thereon because of a difference in an optical path length occurring between the region with the liquid crystal layer and the same without the liquid crystal layer. Accordingly, there will be a need in this case for compensating for the phase modulation by use of the focusing optics 104, or other optics.

Also, with the construction of embodiment 4-B, even in the case that the homogeneous region 903a of the liquid crystal element 903 is converted into a θ° twisted-nematic region, and the 90° twisted-nematic region 903b into a (θ−90)° twisted-nematic region, the same effect can still be obtained because polarization axes of the linearly polarized light passing through respective regions cross each other at right angles.

Now, the optical disc 105 is disposed on the same plane where the beam spot P is formed so as to cross the optical axis O at right angles. The light beam condensed at the beam spot P is reflected from the surface of the optical disc 105, returns along substantially the same path as the incoming optical path, and is split by an optical splitting element 701 after transmitted again through the focusing optics 104.

The light beam 92 thus split is condensed by another focusing optics 702, forming a focused spot Q. The focused spot Q is detected by an optical detection element 704.

Further, the linearly polarized light detection element 703 is disposed halfway between the optical splitting element 701 and optical detection element 704. The preferred orientation (the direction in which the linearly polarized light can be transmitted) of the linearly polarized light detection element 703 is adjusted to be in the direction of the y-axis so as to take out only the component of the effective light beam 91 transmitted through the circular region 104a. Consequently, the component of the effective light beam 91 transmitted through the circumferential portion of the focusing optics 104, having a larger numerical aperture, can be shaded, enabling reproduction of information recorded in CDs.

Further, if the liquid crystal element 903 is turned homeotropic by applying thereto an electric field in the direction of the z-axis and is caused to lose its optical rotating power, all components of the effective light beam 91 can be taken out, enabling the optical apparatus according to the invention to be put to use for DVDs and the like.

In an optical system manufactured by the inventor on an experimental basis, a polarized plate was used for the linearly polarized light detection element 703, and the effective light beam 91 was set to be 5 mm in diameter.

A round through-hole may be made in the center portion of the polarized plate to allow the component of the effective light beam 91, transmitted through the circular region 104a only, to pass straight therethrough. The optical utilization ratio will be improved in this way since light is absorbed by the polarized plate although an optical utilization ratio will not present much problem because a photo diode in widespread use for the optical detection element 704 is highly sensitive as compared with other means.

Furthermore. even if an element. the entire region of which is composed of the 90° twisted-nematic liquid crystals, is used for the liquid crystal element 903, and the circumferential region of the liquid crystal element 903, excluding the circular region thereof for use in the case of CDs, is converted into a homeotropic region by applying an electric field, the same effect can be obtained because polarization axes of the linearly polarized light transmitted through the circular region, and the circumferential region, respectively, cross each other at right angles.

Since the liquid crystal element 903 is used for the optical rotatory element, and the polarized plate, or the like is not used in the optical path for incoming light, loss in light amount will not, in theory, occur. The results of actual measurements indicated a loss of light amount on the order of 15%. However, it is possible to bring the same down to 10% or less by applying non-reflective coating to the glass substrates of the liquid crystal element.

Indistrial Applicability

As described hereinbefore, the invention provides a superresolving optical apparatus which is applicable to optical disc systems, photolithographic masking systems used for fabrication of semiconductors, and the like. Furthermore, with the optical apparatus according to the invention, changeover in application for optical disc systems, that is, from DVDs to CDs, and vice-versa is possible by changing the numerical aperture of the optics.

What is claimed is:

1. An optical apparatus for providing super resolution of an image provided with a focusing optics for focusing linearly polarized light containing such image;

said optical apparatus characterized in that an optical rotatory element having a region wherein a polarization axis of the linearly polarized light can be optically rotated in at least a portion thereof is disposed in an optical path of the linearly polarized light so as to differentiate locally the orientation of the polarization axis of the linearly polarized light; and said optical rotatory element has a $\theta°$ twisted region optically rotatable region capable of optically rotating the polarization axis of the linearly polarized light falling thereon by an switchable angle $\theta°$, and a $(\theta-90)°$ twisted region optically rotatable region capable of optically rotating the polarization axis of the linearly polarized light falling thereon substantially by an angle of $(\theta-90)°$.

2. The optical apparatus according to claim 1, characterized in that said optical rotatory element has a characteristic of being divided into the $\theta°$ optically rotatable region, and the $(\theta-90)°$ optically rotatable region by means of electrical control.

3. The optical apparatus according to claim 2, characterized in that said optical rotatory element is a liquid crystal element, and the alignment direction of liquid crystal molecules of the liquid crystal element, on the incoming side of the linearly polarized light, is set to substantially coincide with, or cross substantially at right angles with, the direction of the polarization axis of the linearly polarized light falling on the liquid crystal element.

4. The optical apparatus according to claim 2, wherein an optically reflective medium is disposed substantially at the focal point of the focusing optics while a light beam reflected from the optically reflective medium is caused to be focused at a point other than the focal point of the focusing optics so that the focused light beam is detected by an optical detection element, and wherein said optical detection element is a linearly polarized light detection element for substantially transmitting only a component of the linearly polarized light, transmitted through either of the $\theta°$ optically rotatable region and the $(\theta-90)°$ optically rotatable region of the optical rotatory element, which is disposed in the optical path of the light beam reflected from the optically reflective medium.

5. The optical apparatus according to claim 1, characterized in that said $\theta°$ optically rotatable region of the optical rotatory element is formed in a substantially circular shape centering around the optical axis of the linearly polarized light falling on the optical rotatory element, while a region of the optical rotatory element other than the $\theta°$ optically rotatable region, is set to be the $(\theta-90)°$ optically rotatable region.

6. The optical apparatus according to claim 1, characterized in that said $\theta°$ optically rotatable region of the optical rotatory element is formed in a substantially oblong shape centering around the optical axis of the linearly polarized light falling on the optical rotatory element, while a region of the optical rotatory element, other than the $\theta°$ optically rotatable region, is set to be the $(\theta-90)°$ optically rotatable region.

7. The optical apparatus according to claim 1, wherein an optically reflective medium is disposed substantially at the focal point of the focusing optics while a light beam reflected from the optically reflective medium is caused to be focused at a point other than the focal point of the focusing optics so that the focused light beam is detected by an optical detection element, and wherein said optical detection element is a linearly polarized light detection element for transmitting only a component of the linearly polarized light, oriented in a given direction, which is disposed in the optical path of the light beam reflected from the optically reflective medium.

8. The optical apparatus according to claim 7, characterized in that said direction in which the component of the linearly polarized light is transmitted through the linearly polarized light detection element is adjusted so as to coincide with the direction in which sidelobes are removed from the linearly polarized light detected by the optical detection element.

9. An optical apparatus for providing super resolution of an image provided with a focusing optics for focusing linearly polarized light containing such image;

said optical apparatus characterized in that an optical rotatory element having a region wherein a polarization axis of the linearly polarized light can be optically rotated in at least a portion thereof is disposed in an optical path of the linearly polarized light so as to differentiate locally the orientation of the polarization axis of the linearly polarized light; and said optical rotatory element has a 90° twisted region optically rotatable region capable of optically rotating the polarization axis of the linearly polarized light falling thereon substantially by 90°, and an optically homogenous unrotatable region capable of transmitting the linearly polarized light falling thereon without optically rotating the polarization axis of the linearly polarized light.

10. The optical apparatus according to claim 9, characterized in that said optical rotatory element is a 90° twisted-nematic liquid crystal element, and the alignment direction of liquid crystal molecules of the liquid crystal element, on the incoming side of the linearly polarized light, is caused to substantially coincide with, or cross at right angles with, the direction of the polarization axis of the linearly polarized light falling on the liquid crystal element, and wherein said liquid crystal element is having a portion of a homogeneous region wherein the liquid crystal molecules are aligned in the direction of the polarization axis of the linearly polarized light falling on the liquid crystal element, rendering the homogeneous region to be said optically unrotatable region.

11. The optical apparatus according to claim 10, characterized by the construction thereof, wherein at least a 90° optically rotatable region of said optical rotatory element, is rendered so that the liquid crystal molecules are homeotropic in alignment by applying a voltage thereto.

12. The optical apparatus according to claim 11, wherein an optically reflective medium is disposed substantially at the focal point of the focusing optics while a light beam reflected from the optically reflective medium is caused to be focused at a point other than the focal point of the focusing optics so that the focused light beam is detected by an optical detection element, and wherein said optical detection element is a linearly polarized light detection element for substantially transmitting only a component of the linearly polarized light, transmitted through either of the 90° optically rotatable region or the optically unrotatable region of the optical rotatory element, which is disposed in the optical path of the light beam reflected from the optically reflective medium.

13. The optical apparatus according to claim 10, characterized in that either of the 90° optically rotatable region or the optically unrotatable region, of said optical rotatory element, is formed in a substantially circular shape centering around the optical axis of the linearly polarized light falling thereon.

14. The optical apparatus according to claim 10, characterized in that either of the 90° optically rotatable region or the optically unrotatable region, of said optical rotatory element, is formed in a substantially oblong shape centering around the optical axis of the linearly polarized light falling thereon.

15. The optical apparatus according to claim 10, characterized in that at least the entire region wherein the linearly polarized light falling on said 90° twisted-nematic liquid crystal element is transmitted is set to be the 90° optically rotatable region, while a portion of the 90° optically rotatable region is turned to be the optically unrotatable region by causing the liquid crystal molecules of the same to become homeotropic in alignment by applying a voltage.

16. The optical apparatus according to claim 15, characterized in that said optically unrotatable region is formed in a substantially circular shape centering around the optical axis of the linearly polarized light falling thereon.

17. The optical apparatus according to claim 15, characterized in that said optically unrotatable region is formed in a substantially oblong shape centering around the optical axis of the linearly polarized light falling thereon.

18. The optical apparatus according to claim 15, wherein an optically reflective medium is disposed substantially at the focal point of the focusing optics while a light beam reflected from the optically reflective medium is caused to be focused at a point other than the focal point of the focusing optics so that the focused light beam is detected by an optical detection element, and wherein said optical detection element is a linearly polarized light detection element for substantially transmitting only a component of the linearly polarized light, transmitted through either of the 90° optically rotatable region and the optically unrotatable region of the optical rotatory element, which is disposed in the optical path of the linearly polarized light reflected from the optically reflective medium.

19. The optical apparatus according to claim 9, wherein an optically reflective medium is disposed substantially at the focal point of the focusing optics while a light beam reflected from the optically reflective medium is caused to be focused at a point other than the focal point of the focusing optics so that the focused light beam is detected by an optical detection element, and wherein said optical detection element is a linearly polarized light detection element for transmitting only a component of the linearly polarized light, oriented in a given direction, which is disposed in the optical path of the light beam reflected from the optically reflective medium.

20. The optical apparatus according to claim 19, characterized in that said direction in which the component of the linearly polarized light is transmitted through the linearly polarized light detection element is adjusted so as to coincide with the direction in which sidelobes are removed from the linearly polarized light detected by the optical detection element.

* * * * *